United States Patent
Axmon et al.

(10) Patent No.: US 11,533,767 B2
(45) Date of Patent: Dec. 20, 2022

(54) ACTIVATION OF SECONDARY CELLS FOR CARRIER AGGREGATION AND DUAL CONNECTIVITY

(71) Applicant: Telefonaktiebolaget LM Ericsson (publ), Stockholm (SE)

(72) Inventors: Joakim Axmon, Limhamn (SE); Muhammad Kazmi, Sundbyberg (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 57 days.

(21) Appl. No.: 16/225,507

(22) Filed: Dec. 19, 2018

(65) Prior Publication Data
US 2019/0261444 A1 Aug. 22, 2019

Related U.S. Application Data

(60) Provisional application No. 62/632,051, filed on Feb. 19, 2018.

(51) Int. Cl.
*H04W 88/08* (2009.01)
*H04W 72/04* (2009.01)
(Continued)

(52) U.S. Cl.
CPC .......... *H04W 76/15* (2018.02); *H04B 7/0626* (2013.01); *H04L 5/00* (2013.01);
(Continued)

(58) Field of Classification Search
CPC .... H04L 5/0098; H04L 5/001; H04W 56/001; H04W 76/28; H04W 24/10;
(Continued)

(56) References Cited

U.S. PATENT DOCUMENTS 8,797,965 B2    8/2014  Alriksson et al.
9,031,175 B2    5/2015  Alriksson et al.
(Continued)

FOREIGN PATENT DOCUMENTS

EP      3264633 A1      1/2018
JP      2015531206 A    10/2015
(Continued)

OTHER PUBLICATIONS

"Way Forward on Scell Addition and Activation Delay", 3GPP TSG-RAN WG4 Meeting AH-1801, San Diego, US, Jan. 22-26, 2018.
(Continued)

*Primary Examiner* — Khaled M Kassim
*Assistant Examiner* — Jason A Harley
(74) *Attorney, Agent, or Firm* — Murphy, Bilak & Homiller, PLLC

(57) ABSTRACT

Embodiments include methods and/or procedures for a user equipment (UE) to activate a secondary cell (SCell) for operating with the UE's primary serving cell (PSC). Embodiments include determining a receiver activity rate for the UE. Embodiments also include receiving, from the PSC, an activation request identifying the SCell. Embodiments also include activating the SCell based on the receiver activity rate. Other embodiments include complementary methods and/or procedures performed by a network node arranged to communicate with one or more UEs via a PSC and at least one selectively activated SCell. Other embodiments include UEs and network nodes configured to perform operations corresponding to various ones of the methods and/or procedures, as well as computer-readable media embodying such operations.

22 Claims, 14 Drawing Sheets

(51) Int. Cl.

| | |
|---|---|
| *H04W 88/02* | (2009.01) |
| *H04L 5/00* | (2006.01) |
| *H04W 72/08* | (2009.01) |
| *H04J 3/06* | (2006.01) |
| *H04W 72/12* | (2009.01) |
| *H04W 56/00* | (2009.01) |
| *H04W 76/15* | (2018.01) |
| *H04W 76/28* | (2018.01) |
| *H04B 7/06* | (2006.01) |
| *H04W 24/08* | (2009.01) |
| *H04W 24/10* | (2009.01) |
| *H04W 80/02* | (2009.01) |

(52) U.S. Cl.
CPC ........... *H04L 5/0048* (2013.01); *H04W 24/08* (2013.01); *H04W 24/10* (2013.01); *H04W 56/001* (2013.01); *H04W 56/0055* (2013.01); *H04W 72/0446* (2013.01); *H04W 72/0453* (2013.01); *H04W 76/28* (2018.02); *H04L 5/001* (2013.01); *H04W 80/02* (2013.01)

(58) Field of Classification Search
CPC ............. H04W 84/045; H04W 72/042; H04W 72/1284; H04B 7/0626
USPC .......................................... 370/329; 330/277
See application file for complete search history.

(56) References Cited

U.S. PATENT DOCUMENTS

| | | | |
|---|---|---|---|
| 9,807,718 B2 | 10/2017 | Axmon et al. | |
| 2002/0042256 A1* | 4/2002 | Baldwin | H03L 7/085 |
| | | | 455/323 |
| 2003/0031130 A1* | 2/2003 | Vanghi | H04L 47/10 |
| | | | 370/235 |
| 2004/0209582 A1* | 10/2004 | Liu | H04L 25/022 |
| | | | 455/136 |
| 2006/0025090 A1* | 2/2006 | Shirakata | H04B 7/0808 |
| | | | 455/234.1 |
| 2013/0188582 A1* | 7/2013 | Dinan | H04W 52/04 |
| | | | 370/329 |
| 2015/0117287 A1* | 4/2015 | Kim | H04W 4/18 |
| | | | 370/311 |
| 2015/0131635 A1 | 5/2015 | Jang et al. | |
| 2015/0230112 A1 | 8/2015 | Siomina et al. | |
| 2015/0304875 A1* | 10/2015 | Axmon | H04W 72/0426 |
| | | | 370/328 |
| 2015/0319778 A1* | 11/2015 | Folke | H04L 5/001 |
| | | | 370/330 |
| 2016/0073370 A1* | 3/2016 | Axmon | H04W 56/0015 |
| | | | 370/350 |
| 2016/0255577 A1 | 9/2016 | Kazmi et al. | |
| 2016/0295607 A1* | 10/2016 | Vajapeyam | H04W 56/00 |
| 2016/0366681 A1 | 12/2016 | Dinan | |
| 2018/0192426 A1* | 7/2018 | Ryoo | H04W 24/10 |

FOREIGN PATENT DOCUMENTS

| | | |
|---|---|---|
| JP | 2016149732 A | 8/2016 |
| JP | 2017517933 A | 6/2017 |
| RU | 2642837 C1 | 1/2018 |
| WO | 2017030478 A1 | 2/2017 |

OTHER PUBLICATIONS

"NR PSCell addition delay", 3GPP TSG-RAN WG4 Meeting #86; R4-1802437; Athens, Greece, Feb. 26-Mar. 2, 2018, pp. 1-3.
"On NR PSCell addition delay", 3GPP TSG RAN WG4 Meeting #86; R4-1802436; Athens, Greece, Feb. 26-Mar. 2, 2018, pp. 1-2.
"On SCell activation", 3GPP TSG RAN WG4 Meeting #86; R4-1802433; Athens, Greece, Feb. 26-Mar. 2, 2018, pp. 1-4.
"SCell activation time", 3GPP TSG-RAN WG4 Meeting #86; R4-1802434; Athens, Greece, Feb. 26-Mar. 2, 2018, pp. 1-3.

* cited by examiner

ACTIVATION OF SECONDARY CELLS FOR CARRIER AGGREGATION AND DUAL CONNECTIVITY

RELATED APPLICATIONS

This application is a non-provisional of, and claims the benefit of priority from, U.S. Patent Application No. 62/632,051 filed on Feb. 19, 2018, which is a U.S. provisional application. The entire disclosure of the above-mentioned application is incorporated herein by reference for all purposes.

TECHNICAL FIELD

The present application relates generally to the field of wireless communication systems and methods, and more specifically to devices, methods, and computer-readable media that improve the activation of secondary cells (SCells) in carrier aggregation (CA) and dual connectivity (DC) configurations used to communicate between a wireless device and a wireless network.

BACKGROUND

Long Term Evolution (LTE) is an umbrella term for so-called fourth-generation (4G) radio access technologies developed within the Third-Generation Partnership Project (3GPP) and initially standardized in Releases 8 and 9, also known as Evolved UTRAN (E-UTRAN). LTE is targeted at various licensed frequency bands, including the 700-MHz band in the United States. LTE is accompanied by improvements to non-radio aspects commonly referred to as System Architecture Evolution (SAE), which includes Evolved Packet Core (EPC) network. LTE has continued to evolve through subsequent releases. One of the features of Release 11 is an enhanced Physical Downlink Control Channel (ePDCCH), aiming at increasing capacity and improving spatial reuse of control channel resources, improving inter-cell interference coordination (ICIC), and supporting antenna beamforming and/or transmit diversity for control channel.

In addition, LTE Rel-10 (Rel-10) supports bandwidths larger than 20 MHz. One important requirement on Rel-10 is to assure backward compatibility with LTE Release-8. This also includes spectrum compatibility. As such, a wideband LTE Rel-10 carrier (e.g., wider than 20 MHz) appears as a number of carriers to an LTE Rel-8 terminal. Each such carrier can be referred to as a Component Carrier (CC). For an efficient use of a wide carrier also for legacy terminals, legacy terminals can be scheduled in all parts of the wideband LTE Rel-10 carrier. One exemplary way to achieve this is by Carrier Aggregation (CA), whereby an LTE Rel-10 terminal can receive multiple CCs, each having the same structure as a Rel-8 carrier.

An example of CA is illustrated in FIG. 4. In this example, base station 100 (e.g., an eNodeB or eNB, for short) provides service or coverage to user equipment (UE), such as wireless device 102, using three different cells, labelled PCell1, SCell2, and SCell3 in the diagram. The coverage in these cells are provided by three different component carriers CC1, CC2, and CC3, respectively. It should be noted that this configuration is just an illustrative example, and CA configurations using any number of carriers and cells may be employed.

In the context of LTE, a primary cell (PCell, e.g., PCell1) is defined as the "main" cell serving the wireless device such that both data and control signaling can be transmitted over the PCell, while one or more supplementary or secondary cells (SCells, e.g., SCell2 and SCell3) are typically used for transmitting data only, the SCell(s) providing extra bandwidth to enable greater data throughput. A CA-capable UE can be assigned a PCell (e.g., PCell1) that is always activated, and one or more SCells (e.g., SCell2 and/or SCell3) that can be activated or deactivated dynamically.

The number of aggregated CCs as well as the bandwidth of the individual CC may be different for uplink and downlink. A symmetric configuration refers to the case where the number of CCs in downlink and uplink is the same whereas an asymmetric configuration refers to the case that the number of CCs is different. It is important to note that the number of CCs configured in a cell may be different from the number of CCs seen by a terminal: A terminal can, for example, support more downlink CCs than uplink CCs, even though the cell is configured with the same number of uplink and downlink CCs.

The UE can perform periodic cell search and measurements of signal power and quality (e.g., RSRP and RSRQ) in RRC Connected mode. The UE is responsible for detecting new neighbor cells, and for tracking and monitoring already detected cells. The detected cells and the associated measurement values are reported to the network. Reports to the network can be configured to be periodic or aperiodic based a particular event. Such reports are commonly referred to as mobility measurement reports and contain channel state information (CSI). These reports can be used, e.g., to make decisions on dynamic activation or deactivation of SCells in a UE's CA configuration. In LTE Release-10, a CSI-specific reference symbol sequence (known as CSI-RS) was introduced for the intent to estimate CSI for the downlink channel. By measuring a CSI-RS, a UE can estimate the effective downlink channel including the radio propagation channel and antenna gains.

In LTE, SCell activation times are based on existence of cell-specific reference signals (CRS), primary synchronization channel (PSS), and secondary synchronization channel (SSS) every five (5) milliseconds (ms) when accounting for time-division duplexing (TDD) configuration and multicast broadcast single-frequency network (MBSFN) subframes. The UE uses those signals to search for a suitable gain ("gain search"), confirm the presence of the SCell and synchronize time and frequency with it, and measure CSI (and/or parameters such as RSRP, RSRQ from which CSI can be derived). The CSI can then be reported to the network (e.g., to the serving base station or eNB), which can use it to make dynamic activation decisions. For example, the CSI in the measurement report can include at least one of a rank indicator (RI), precoding matrix indicator (PMI), and a channel quality indicator (CQI).

The LTE gain search is based on one subframe, using CRS spread out in four (4) OFDM symbols for a power measurement (e.g., RSSI), upon which the gain settings of the UE's low-noise amplifier (LNA), variable-gain amplifier (VGA), and digital gain (if any) can be adjusted and/or determined. Based on these adjusted settings, a new power measurement can be carried out, repeating until a suitable gain setting is found. Even so, a relatively short SCell activation time is needed to facilitate load balancing in the scheduling performed by the eNB. In LTE, a UE is allowed 24 subframes to report CSI for a "known" SCell, and 34 subframes to report CSI for an "unknown" SCell. In the context of SCells, the terms "known" and "unknown" refer to the UE's knowledge of the particular SCell's timing and/or synchronization state with respect to the SCell.

While LTE was primarily designed for user-to-user communications, 5G (also referred to as "NR") cellular networks are envisioned to support both high single-user data rates (e.g., 1 Gb/s) and large-scale, machine-to-machine communication involving short, bursty transmissions from many different devices that share the frequency bandwidth. The 5G radio standards (also referred to as "New Radio" or "NR") are currently targeting a wide range of data services including eMBB (enhanced Mobile Broad Band) and URLLC (Ultra-Reliable Low Latency Communication). These services can have different requirements and objectives. For example, URLLC is intended to provide a data service with extremely strict error and latency requirements, e.g., error probabilities as low as $10^{-5}$ or lower and 1 ms end-to-end latency or lower. For eMBB, the requirements on latency and error probability can be less stringent whereas the required supported peak rate and/or spectral efficiency can be higher.

In NR CA configurations, the steps taken in SCell activation can be essentially the same as in LTE. However, the signals upon which the activation procedure is based (i.e., the signals the UE measures) can occur much more sparsely, or over a longer time period, than in LTE. In particular, these signals are bundled into SS/PBCH blocks (SSBs) of four (4) adjacent OFDM symbols, each block comprising a combination of PSS, SSS, demodulation reference signals (DM-RS), and physical broadcast channel (PBCH). The SSB measurement timing configuration (SMTC), provided by the network, can be up to 160 ms. Depending on the subcarrier spacing (SCS) in use, the NR symbol length can also be considerably shorter than in LTE. As such, it is possible that a gain search can require several SMTCs.

In the 3GPP standardization work for NR, several companies have proposed SCell activation times of 8-9 SMTC cycles, leading to very long activation times of 1.28-1.44 seconds for SMTC of 160 ms. This is highly undesirable from scheduling point of view since it would be difficult to use the carrier for required load balancing, etc. A possible workaround is for an NR base station (referred to as "gNB") to activate an SCell and leave it activated until the UE leaves RRC Connected state; however, this would lead to a significant increase in UE power consumption.

SUMMARY

Accordingly, there is a need for an improved technique for NR SCell activation that facilitates timely load balancing in the NR gNB but does not result in significant increases in UE power consumption and, as a consequence, decreases in UE battery life.

To address at least some of such issues and/or problems, certain exemplary embodiments of apparatus, devices, methods, and computer-readable media according to the present disclosure can utilize different procedures for SCell activation depending on the user equipment (UE) activity rate for performing SCell measurements, thereby improving performance of both the UE and the network in carrier aggregation (CA) and dual connectivity (DC) scenarios, as compared to existing techniques. Exemplary methods, systems, devices, and computer-readable media according to the present disclosure can reduce overall SCell activation time and UE power consumption in these scenarios by efficiently adapting to measurement conditions for each SCell, thereby vastly outperforming conventional methods, techniques, and systems in various known applications, including exemplary applications discussed herein.

Certain exemplary embodiments include methods and/or procedures for a user equipment (UE) to activate a secondary cell (SCell) for operating with the UE's primary serving cell (PSC) in a wireless network. The exemplary methods and/or procedures can include determining a receiver activity rate for the UE. The exemplary methods and/or procedures can also include receiving, from the PSC, an activation request identifying the SCell. The exemplary methods and/or procedures can also include activating the SCell based on the receiver activity rate.

In some embodiments, activating the SCell based on the receiver activity rate can include various operations such as: determining a duration, T, since the UE's last measurement of a signal transmitted by the SCell; determining whether T is greater than a first threshold, T0, that is a function of the receiver activity rate; if T is greater than T0, activating the SCell according to a first activation procedure; and otherwise, activating the SCell according to a second activation procedure. In some embodiments, the second activation procedure can include a second normal activation procedure and a second fast activation procedure, where the duration of the second normal activation procedure is greater than the duration of the second fast activation procedure. In some embodiments, the duration of the first activation procedure can be greater than the duration of the second normal activation procedure.

Other embodiments include exemplary methods and/or procedures performed by a network node arranged to communicate with one or more user equipment (UEs) via a primary serving cell (PSC) and at least one selectively activated secondary cell (SCell). The exemplary methods and/or procedures can include determining a receiver activity rate needed to support activation of the at least one SCell by the one or more UEs. The exemplary methods and/or procedures can also include sending one or more parameters related to the receiver activity rate to the one or more UEs. The exemplary methods and/or procedures can also include sending, to a particular UE of the one or more UEs, a request to activate a particular SCell of the at least one SCell. The exemplary methods and/or procedures can also include receiving, from the particular UE, a second valid measurement report pertaining to the particular SCell.

In some embodiments, a first duration between sending the request to activate the particular SCell and receiving the second valid measurement report can be a function of the one or more parameters sent to the UE. In some embodiments, the exemplary methods and/or procedures can also include, prior to sending the request to activate the particular SCell to the particular UE, receiving a first valid measurement report pertaining to the particular SCell from the particular UE. In such embodiments, the first duration can also be a function of a second duration between receiving the first valid measurement report and sending the request to activate the particular SCell . . . .

Other exemplary embodiments include UEs and network nodes configured and/or arranged to perform operations corresponding to various ones of the exemplary methods and/or procedures described above. Other exemplary embodiments include non-transitory, computer-readable media storing program instructions that, when executed by at least one processor comprising a UE or network node, configure the UE or network node to perform operations corresponding to various ones of the exemplary methods and/or procedures described above.

BRIEF DESCRIPTION OF THE DRAWINGS

Further objects, features and advantages of the present disclosure will become apparent from the following detailed description taken in conjunction with the accompanying Figures showing illustrative embodiments, in which.

While the present disclosure will now be described in detail with reference to the figures, it is done so in connection with the illustrative embodiments and is not limited by the particular embodiments illustrated in the figure(s) or in the appended exemplary embodiments.

DETAILED DESCRIPTION

Figure 1:
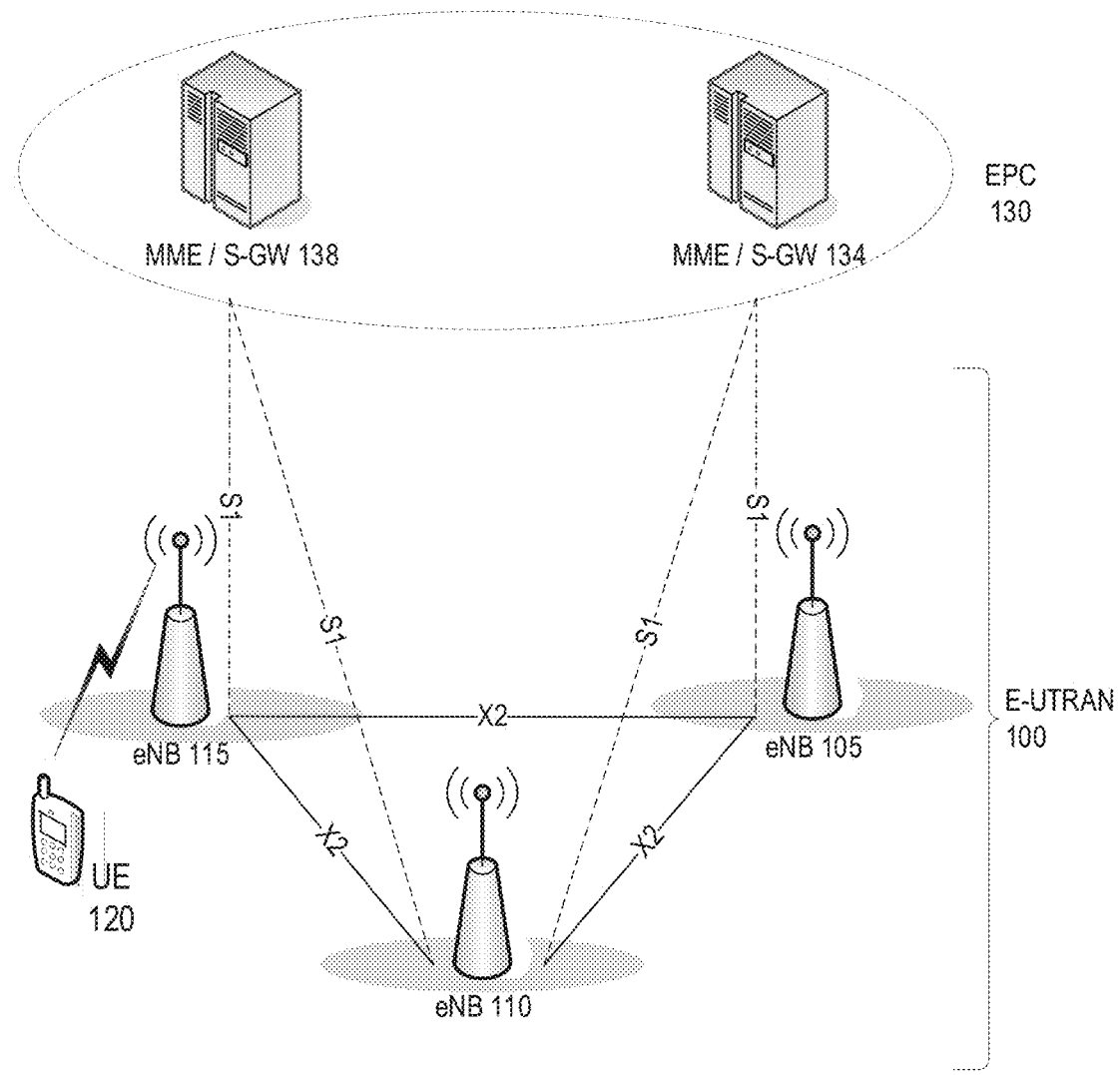
FIG. 1 is a high-level block diagram of an exemplary architecture of the Long-Term Evolution (LTE) Evolved UTRAN (E-UTRAN) and Evolved Packet Core (EPC) network, as standardized by 3GPP.

An overall exemplary architecture of a network comprising LTE and SAE is shown in FIG. 1. E-UTRAN 100 comprises one or more evolved Node B's (eNB), such as eNBs 105, 110, and 115, and one or more user equipment (UE), such as UE 120. As used within the 3GPP standards, "user equipment" or "UE" means any wireless communication device (e.g., smartphone, computing device, measuring device, etc.) that is capable of communicating with 3GPP-standard-compliant network equipment, including E-UTRAN as well as UTRAN and/or GERAN, as the third- ("3G") and second-generation ("2G") 3GPP radio access networks are commonly known.

As specified by 3GPP, E-UTRAN 100 is responsible for all radio-related functions in the network, including radio bearer control, radio admission control, radio mobility control, scheduling, and dynamic allocation of resources to UEs in uplink and downlink, as well as security of the communications with the UE. These functions reside in the eNBs, such as eNBs 105, 110, and 115. The eNBs in the E-UTRAN communicate with each other via the X1 interface, as shown in FIG. 1. The eNBs also are responsible for the E-UTRAN interface to the EPC 130, specifically the SI interface to the Mobility Management Entity (MME) and the Serving Gateway (SGW), shown collectively as MME/S-GWs 134 and 138 in FIG. 1. Generally speaking, the MME/S-GW handles both the overall control of the UE and data flow between the UE and the rest of the EPC. More specifically, the MME processes the signaling protocols between the UE and the EPC, which are known as the Non-Access Stratum (NAS) protocols. The S-GW handles all Internet Procotol (IP) data packets between the UE and the EPC, and serves as the local mobility anchor for the data bearers when the UE moves between eNBs, such as eNBs 105, 110, and 115.

Figure 2A:
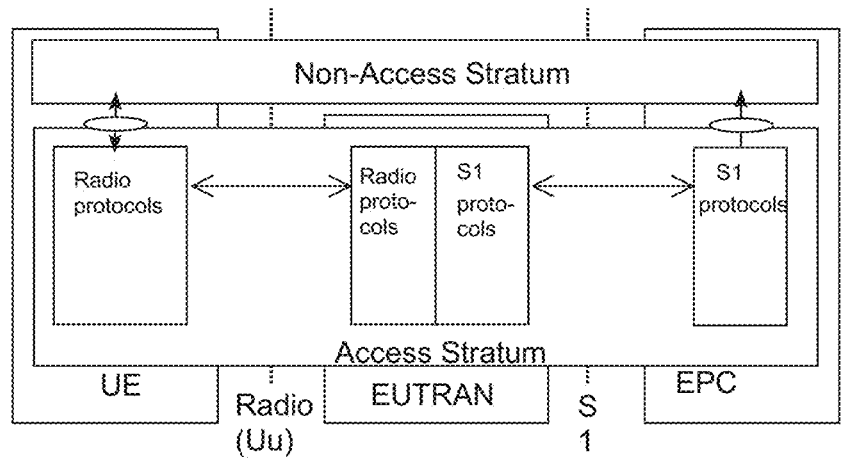
FIG. 2A is a high-level block diagram of an exemplary E-UTRAN architecture in terms of its constituent components, protocols, and interfaces.

FIG. 2A shows a high-level block diagram of an exemplary LTE architecture in terms of its constituent entities—UE, E-UTRAN, and EPC—and high-level functional division into the Access Stratum (AS) and the Non-Access Stratum (NAS). FIG. 1 also illustrates two particular interface points, namely Uu (UE/E-UTRAN Radio Interface) and SI (E-UTRAN/EPC interface), each using a specific set of protocols, i.e., Radio Protocols and SI Protocols. Each of the two protocols can be further segmented into user plane (or "U-plane") and control plane (or "C-plane") protocol functionality. On the Uu interface, the U-plane carries user information (e.g., data packets) while the C-plane is carries control information between UE and E-UTRAN.

Figure 2B:
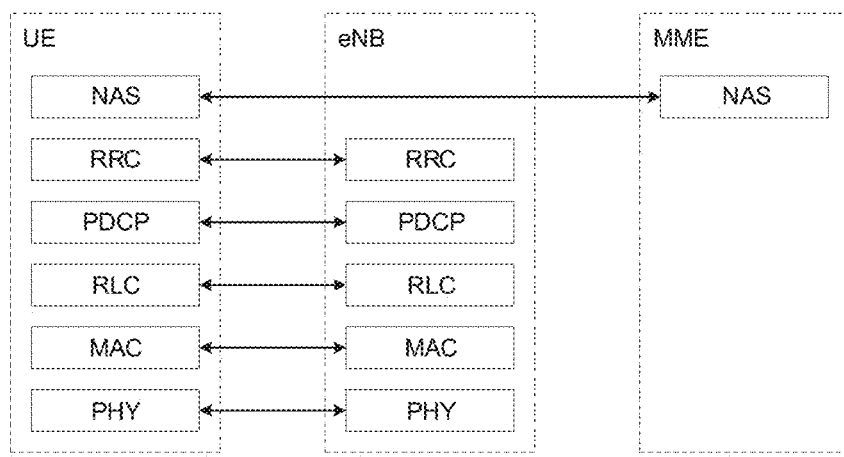
FIG. 2B is a block diagram of exemplary protocol layers of the control-plane portion of the radio (Uu) interface between a user equipment (UE) and the E-UTRAN.

FIG. 2B illustrates a block diagram of an exemplary C-plane protocol stack on the Uu interface comprising Physical (PHY), Medium Access Control (MAC), Radio Link Control (RLC), Packet Data Convergence Protocol (PDCP), and Radio Resource Control (RRC) layers. The PHY layer is concerned with how and what characteristics are used to transfer data over transport channels on the LTE radio interface. The MAC layer provides data transfer services on logical channels, maps logical channels to PHY transport channels, and reallocates PHY resources to support these services. The RLC layer provides error detection and/or correction, concatenation, segmentation, and reassembly, reordering of data transferred to or from the upper layers. The PHY, MAC, and RLC layers perform identical functions for both the U-plane and the C-plane. The PDCP layer provides ciphering/deciphering and integrity protection for both U-plane and C-plane, as well as other functions for the U-plane such as header compression.

Figure 2C:
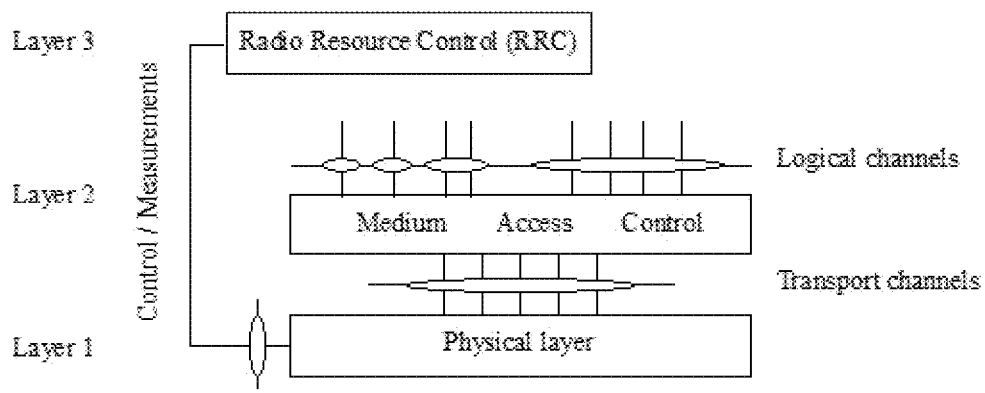
FIG. 2C is a block diagram of an exemplary LTE radio interface protocol architecture from the perspective of the PHY layer.

FIG. 2C shows a block diagram of an exemplary LTE radio interface protocol architecture from the perspective of the PHY. The interfaces between the various layers are provided by Service Access Points (SAPs), indicated by the ovals in FIG. 2C. The PHY layer interfaces with the MAC and RRC protocol layers described above. The MAC provides different logical channels to the RLC protocol layer (also described above), characterized by the type of information transferred, whereas the PHY provides a transport channel to the MAC, characterized by how the information is transferred over the radio interface. In providing this transport service, the PHY performs various functions including error detection and correction; rate-matching and mapping of the coded transport channel onto physical channels; power weighting, modulation; and demodulation of physical channels; transmit diversity, beamforming multiple input multiple output (MIMO) antenna processing; and providing radio measurements to higher layers, such as RRC. Downlink (i.e., eNB to UE) physical channels provided by the LTE PHY include Physical Downlink Shared Channel (PDSCH), Physical Multicast Channel (PMCH), Physical Downlink Control Channel (PDCCH), Relay Physical Downlink Control Channel (R-PDCCH), Physical Broadcast Channel (PBCH), Physical Control Format Indicator Channel (PCFICH), and Physical Hybrid ARQ Indicator Channel (PHICH).

Figure 3A:
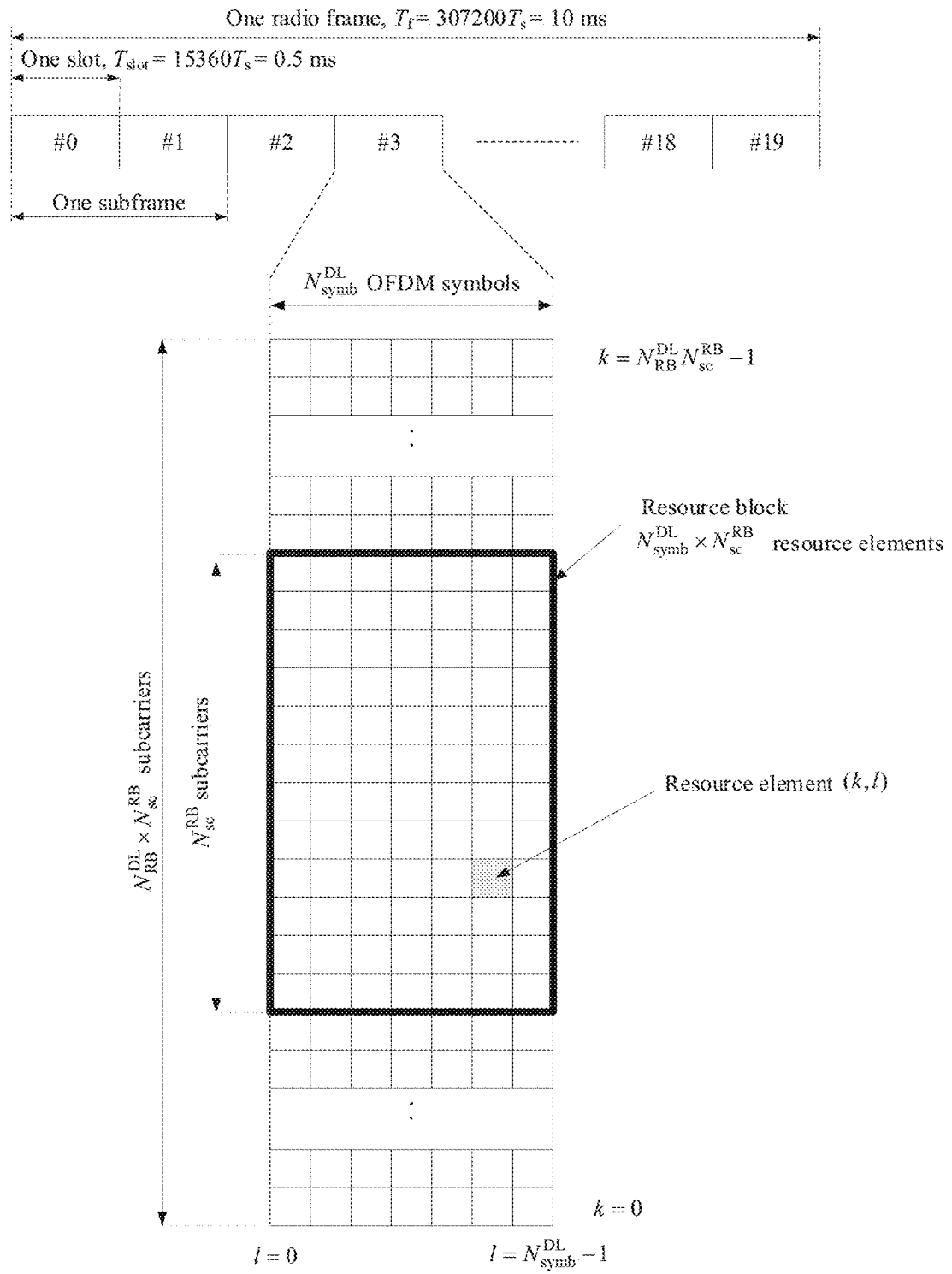
FIGS. 3A-B are exemplary diagrams illustrating the arrangement of resources in the LTE downlink radio interface used for frequency-division duplex (FDD) operation.

The multiple access scheme for the LTE PHY is based on Orthogonal Frequency Division Multiplexing (OFDM) with a cyclic prefix (CP) in the downlink, and on Single-Carrier Frequency Division Multiple Access (SC-FDMA) with a cyclic prefix in the uplink. To support transmission in paired and unpaired spectrum, the LTE PHY supports both Frequency Division Duplexing (FDD) (including both full- and half-duplex operation) and Time Division Duplexing (TDD). FIG. 3A shows the radio frame structure used for FDD downlink (DL) operation. The radio frame has a fixed duration of 10 ms and consists of 20 slots, labeled 0 through 19, each with a fixed duration of 0.5 ms. A 1-ms subframe comprises two consecutive slots where subframe i consists of slots 2i and 2i+1. Each exemplary downlink slot consists of $N^{DL}_{symb}$ OFDM symbols, each of which is comprised of $N_{sc}$ OFDM subcarriers. Exemplary values of $N^{DL}_{symb}$ can be 7 (with a normal CP) or 6 (with an extended-length CP) for subcarrier bandwidth of 15 kHz. The value of $N_{sc}$ is configurable based upon the available channel bandwidth. Since persons of ordinary skill in the art are familiar with the principles of OFDM, further details are omitted in this description. An exemplary uplink slot can be configured in similar manner as shown in FIG. 3, but comprises $N^{UL}_{symb}$ OFDM symbols, each of which is comprised of $N_{sc}$ OFDM subcarriers.

As shown in FIG. 3A, a combination of a particular subcarrier in a particular symbol is known as a resource element (RE). Each RE is used to transmit a particular number of bits, depending on the type of modulation and/or bit-mapping constellation used for that RE. For example, some REs may carry two bits using QPSK modulation, while other REs may carry four or six bits using 16- or 64-QAM, respectively. The radio resources of the LTE PHY are also defined in terms of physical resource blocks (PRBs). A PRB spans $N^{RB}_{sc}$ sub-carriers over the duration of a slot (i.e., $N^{DL}_{symb}$ symbols), where $N^{RB}_{sc}$ is typically either 12 (with a 15-kHz subcarrier bandwidth) or 24 (7.5-kHz subcarrier bandwidth). A PRB spanning the same $N^{RB}_{sc}$ sub-carriers during an entire subframe (i.e., $2N^{DL}_{symb}$ symbols) is known as a PRB pair. Accordingly, the resources available in a subframe of the LTE PHY downlink comprise $N^{DL}_{RB}$ PRB pairs, each of which comprises $2N^{DL}_{symb} \cdot N^{RB}_{sc}$ REs. For a normal CP and 15-KHz sub-carrier bandwidth, a PRB pair comprises 168 REs.

One exemplary characteristic of PRBs is that consecutively numbered PRBs (e.g., $PRB_i$ and $PRB_{i+1}$) comprise consecutive blocks of subcarriers. For example, with a normal CP and 15-KHz sub-carrier bandwidth, $PRB_0$ comprises sub-carrier 0 through 11 while $PRB_1$ comprises sub-carries 12 through 23. The LTE PHY resource also can be defined in terms of virtual resource blocks (VRBs), which are the same size as PRBs but may be of either a localized or a distributed type. Localized VRBs can be mapped directly to PRBs such that VRB $n_{VRB}$ corresponds to PRB $n_{PRB}=n_{VRB}$. On the other hand, distributed VRBs can be mapped to non-consecutive PRBs according to various rules, as described in 3GPP Technical Specification (TS) 36.214 or otherwise known to persons of ordinary skill in the art. However, the term "PRB" shall be used in this disclosure to refer to both physical and virtual resource blocks. Moreover, the term "PRB" will be used henceforth to refer to a resource block for the duration of a subframe, i.e., a PRB pair, unless otherwise specified.

As discussed above, the LTE PHY maps the various downlink and uplink physical channels to the resources shown in FIG. 3A. For example, the PDCCH carries scheduling assignments, channel quality feedback (e.g., CSI) for the uplink channel, and other control information. Likewise, a Physical Uplink Control Channel (PUCCH) carries uplink control information such as scheduling requests, CSI for the downlink channel, hybrid ARQ feedback, and other control information. Both PDCCH and PUCCH are transmitted on aggregations of one or several consecutive control channel elements (CCEs), and a CCE is mapped to the physical resource shown in FIG. 3A based on resource element groups (REGs), each of which is comprised of a plurality of REs. For example, a CCE may be comprised of nine (9) REGs, each of which is comprised of four (4) REs.

Figure 3B:
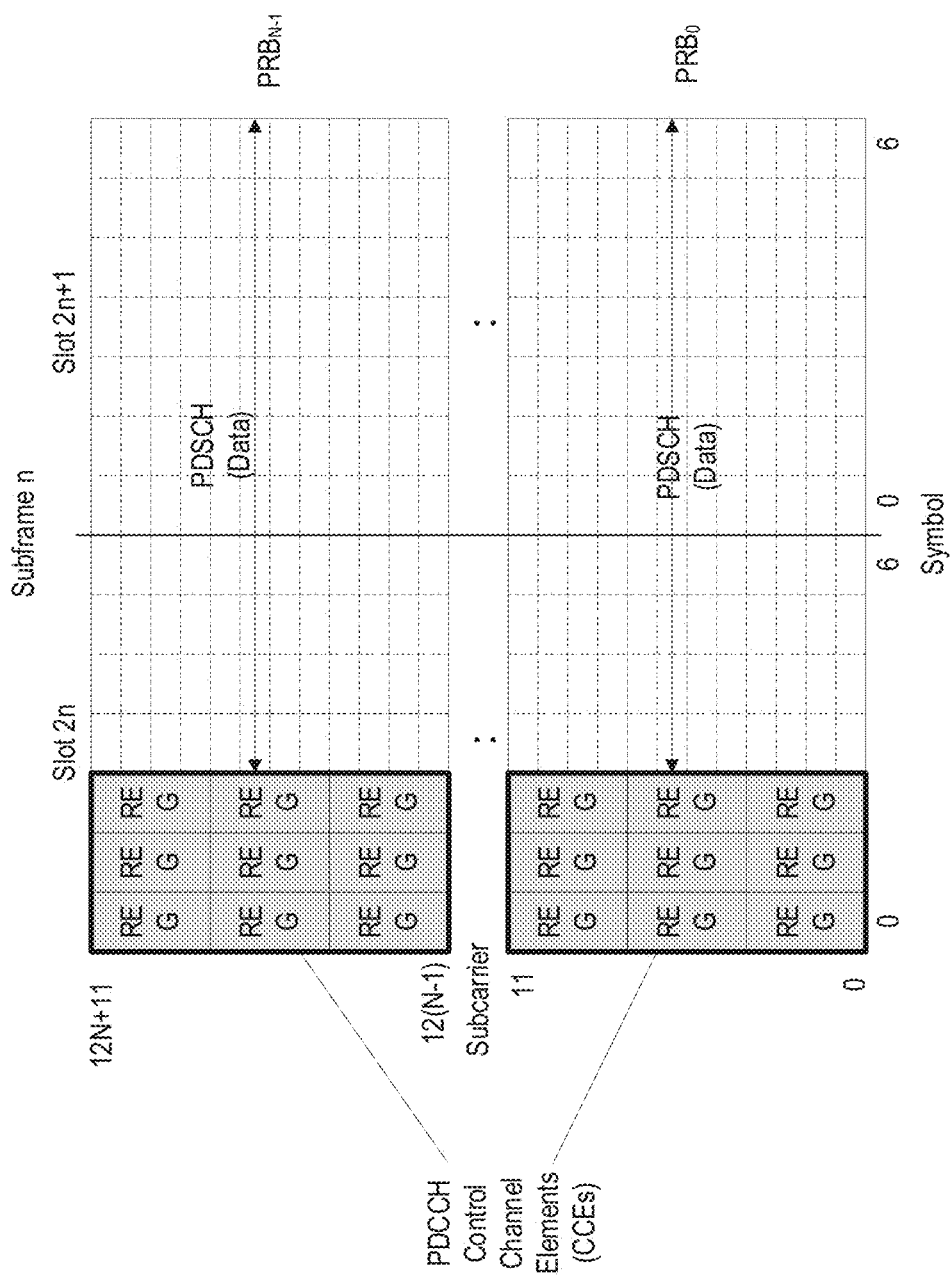
Figure 4:
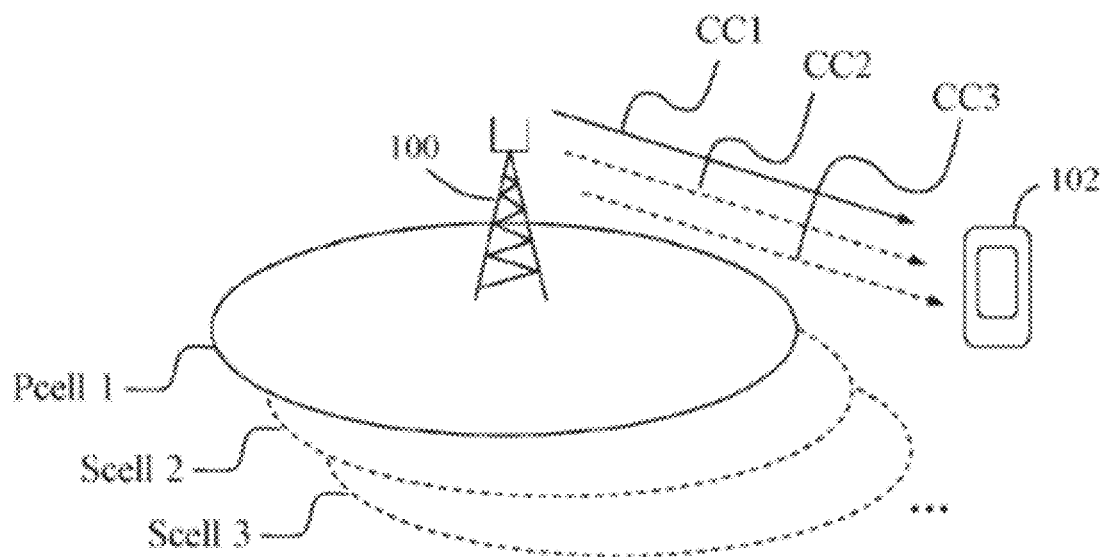
FIG. 4 is a block diagrams showing an exemplary carrier aggregation (CA) arrangement of a PCell and SCells, usable with one or more exemplary embodiments of the present disclosure.

FIG. 3B illustrates one exemplary manner in which the CCEs and REGs can be mapped to the physical resource, i.e., PRBs. As shown in FIG. 3B, the REGs comprising the CCEs of the PDCCH can be mapped into the first three symbols of a subframe, whereas the remaining symbols are available for other physical channels, such as the PDSCH which carries user data. Each of the REGs comprises four REs, which are represented by the small, dashed-line rectangles. Since QPSK modulation is used for the PDCCH, in the exemplary configuration of FIG. 3B, each REG comprises eight (8) bits and each CCE comprises 72 bits. Although two CCEs are shown in FIG. 3B, the number of CCEs may vary depending on the required PDCCH capacity, determined by number of users, amount of measurements and/or control signaling, etc. Moreover, other ways of mapping REGs to CCEs will be apparent to those of ordinary skill in the art. On the uplink, PUCCH can be configured similarly, except that the number of bits per CCE varies because PUCCH uses either QPSK or BPSK depending on particular message contents.

Beginning with Release 11, the 3GPP specifications include an enhanced PDCCH (ePDCCH) in addition to the legacy PDCCH described above. The ePDCCH is intended to increase capacity and improve spatial reuse of control channel resources, improve inter-cell interference coordination (ICIC), and add antenna beamforming and/or transmit diversity support for control channel. Much like the Release-8 PDCCH, the ePDCCH can be constructed by aggregating one or more enhanced control channel elements (eCCEs). An eCCE comprises one or more enhanced resource element groups (eREGs), each of which comprises one or more REs. For example, an eCCE comprised of nine eREGs, each having four REs, can be configured with the same capacity as a CCE. Unlike CCEs, however, eCCEs can be flexibly configured with various numbers and sizes of eREGs.

Moreover, the ePDCCH (i.e., eCCEs) can be mapped to PRBs for transmission either in a localized or distributed manner. The localized mapping provides frequency selective scheduling gain and beamforming gain while the distributed transmission provides robust ePDCCH transmission via frequency diversity in case valid channel state information is not available to the receiver. In order to achieve sufficient frequency diversity, however, each eCCE must be mapped to a minimum number PRBs distributed sufficiently throughout the range of sub-carriers in the physical resource.

Figure 5:
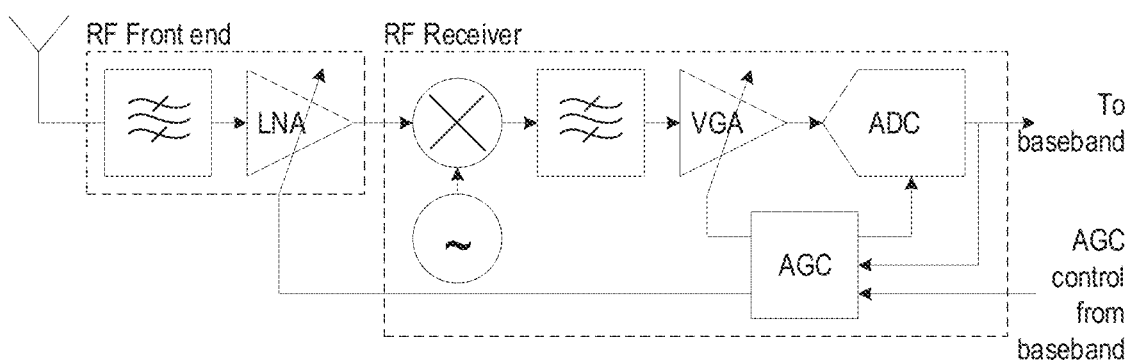
FIG. 5 is a block diagram of an exemplary LTE and/or NR radio frequency (RF) receiver for a user equipment (UE), according to one or more exemplary embodiments of the present disclosure.

FIG. 5 is a block diagram of an exemplary LTE and/or NR radio frequency (RF) receiver for a user equipment (UE), according to one or more exemplary embodiments of the present disclosure. As shown in FIG. 5, an RF signal (e.g., a signal from an LTE eNB or an NR gNB) is picked up by an antenna, passed through an RF filter, and amplified by a low-noise amplifier (LNA). The signal is passed through a mixer which translates (or demodulates) the signal down to baseband, the mixer also being controlled by a local oscillator. The demodulated signal is passed through a filter that suppresses demodulation products other than the desired baseband signal. The filtered baseband signal is passed through a variable gain amplifier (VGA) that adjusts the amplitude of the signal to be within a suitable range for sampling and analog-to-digital conversion carried out by the analog-to-digital converter (ADC).

The LNA and VGA can be controlled by automatic gain control (AGC) functionality that can reside partly in the RF receiver and partly in a baseband circuit (not shown) that is coupled to the RF receiver. The baseband circuit can be, e.g., a digital or mixed-signal baseband application-specific integrated circuit (ASIC). Examples of AGC-related functionality in the RF receiver include power detection and clipping/saturation detection. Examples of AGC-related functionality in the baseband include reference signal (RS) received power (RSRP) detection. In exemplary configurations, the LNA can utilize two or three operating points, each suitable for a particular received signal power range based on a particular gain setting. In case of two operating points, the operating points (or gain settings) can be referred to as high gain and low gain. In case of three operating points, they can be referred to as high gain, mid gain, and low gain, respectively.

When the received signal power range is unknown, the UE can check available gain settings systematically until it detects there is significant received power after the ADC, but without saturation. Detection of saturation can indicate that the LNA is providing too much gain, and an operating point with lower gain can be selected. On the other hand, if it is detected that the signal is too low after the ADC, an operating point with higher gain can be selected. This procedure corresponds to the "gain search" briefly mentioned above. The gain search preferably is carried out when it is known that there are signals present; otherwise, the LNA may be configured with too high gain and once received signals are present, their overamplification can result in clipping and/or saturation, signal distortion, and loss of information.

Figure 6A:
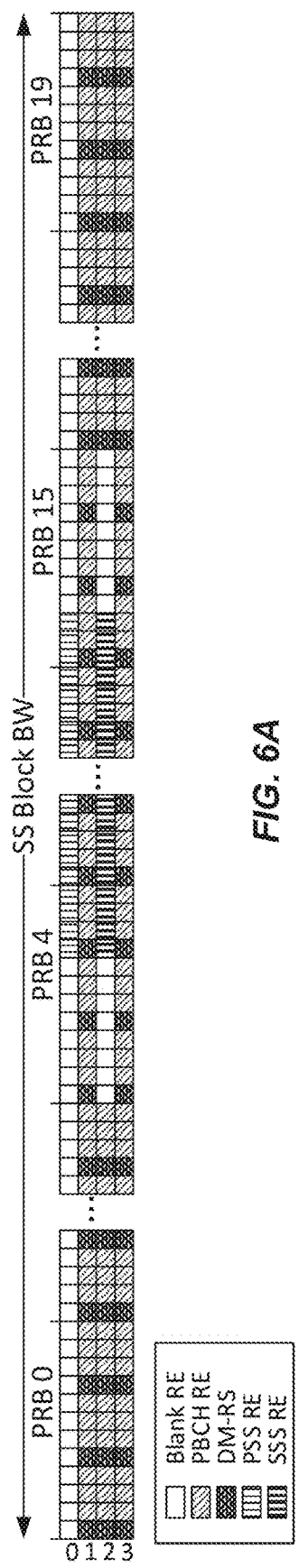
FIGS. 6A-6C show various exemplary time-frequency configurations of NR SS/PBCH blocks (SSBs) usable with one or more exemplary embodiments of the present disclosure.
Figure 6B:
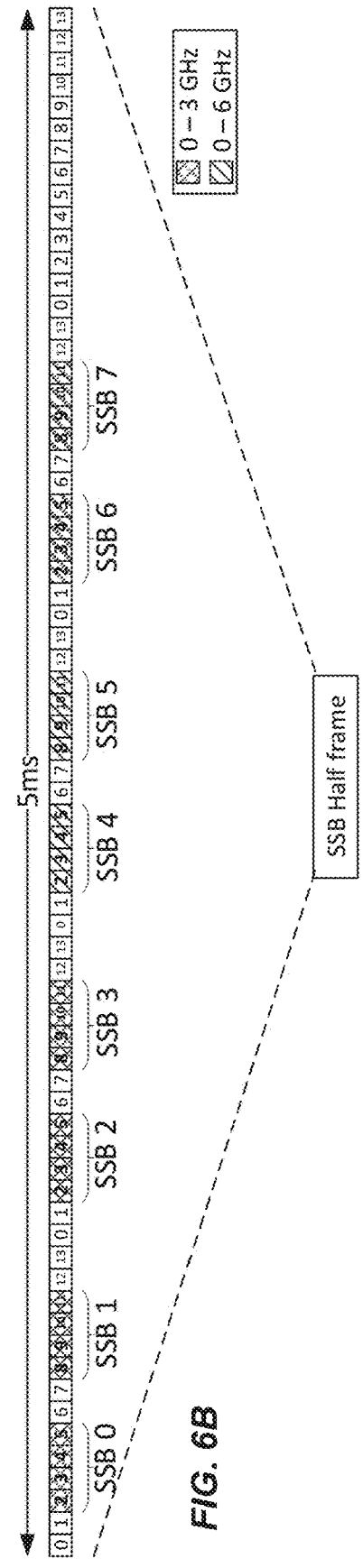
Figure 6C:
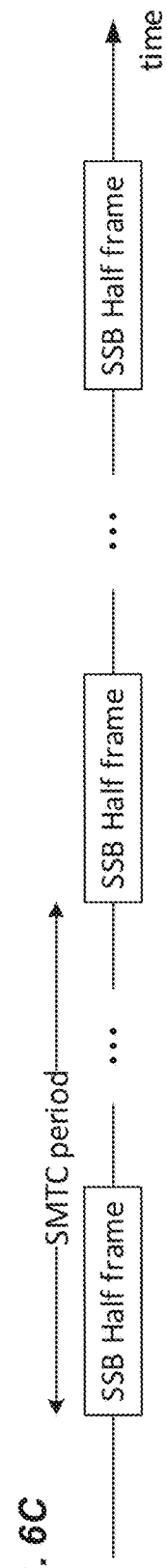

An exemplary configuration for an NR SSB, briefly mentioned above, is illustrated in FIG. 6A. The NR SSB comprises a Primary Synchronization Signal (PSS), a Secondary Synchronization Signal (SSS), a Physical Broadcast Channel (PBCH), and Demodulation Reference Symbols (DM-RS). As also shown in FIG. 6A, an individual SSB spans four adjacent OFDM symbols within a PRB. Multiple SSBs comprise an SSB burst, which is transmitted within a half-frame (e.g., 5 ms). Moreover, within the half-frame, multiple SSBs for different cells or different beams may be transmitted, as illustrated with SSB indices 0-7 in FIG. 6B. The number of SSB locations in a burst depends on the frequency range (e.g., 0-3 or 0-6 GHz as shown in FIG. 6B), as well as on the particular NR radio interface configuration. The SSB burst (hence the individual SSBs) are transmitted according to an SSB measurement timing configuration (SMTC) cycle, which may be 5, 10, 20, 40, 80 or 160 ms, as illustrated in FIG. 6C.

When a UE receives an SCell activation request, the position of the SSB within the SSB burst, as well as the location of the SSB, is already known to the UE via signaling in the PCell. Nevertheless, the SSB represents the only signals that the UE can assume to be present in an NR cell (unless the UE has been informed that SSB is not transmitted).

As mentioned above, various existing and/or proposed techniques for NR require SCell activation times of 8-9 SMTC cycles, leading to very long activation times of 1.28-1.44 seconds for the maximum SMTC of 160 ms. This is highly undesirable from scheduling point of view since it would be hard to use the carrier for required load balancing, etc. As also mentioned above, it is possible to reduce, mitigate, and/or eliminate the effects of such long activation times by activating an SCell when the UE enters RRC Connected state—regardless of the actual need—and leaving it activated until the UE leaves RRC Connected state. However, this would lead to a significant increase in UE power consumption due to the need to monitor both PCell and SCell, without providing any noticeable benefit to the UE itself.

To address these and other exemplary problems and/or issues, exemplary embodiments of the present disclosure can apply different activation procedures for NR SCell activation depending on the reliability or uncertainty of the UE receiver's gain state (e.g., gain setting). With such techniques, the time needed by the UE for determining a valid gain setting (referred to, e.g., as automatic gain control (AGC)) can be lowered significantly compared to applying conventional techniques such as used in LTE SCell activation procedures. Accordingly, the reliance on the reliability of the UE receiver's gain state can reduce, improve, and/or optimize the time required by the UE to activate the SCell. For example, the SCell activation time is shorter when the gain state is more reliable than when the gain state is less reliable. In some exemplary embodiments, the reliability of the gain state can be determined based on at least how frequently and/or recently the UE previously measured or synchronized (e.g., acquired timing) with respect to the SCell to be activated. This frequency or recentness can depend upon the UE receiver's activity rate for acquisition and/or measurement of the SCell's reference signals prior to the initiation of the SCell activation.

In addition to reducing the activation time for NR SCells (e.g., an average activation time), exemplary benefits of such novel techniques include more robust resource utilization and/or scheduling in the PCells and SCells provided by an NR gNB. Exemplary benefits also include reduced UE power consumption, due to both reduced gain search and the ability to promptly activate and deactivate SCells according to need. Such exemplary benefits constitute specific improvements to wireless communication networks and devices, particularly with respect to operation of carrier aggregation (CA) or dual connectivity (DC) in NR and/or LTE/LTE-A devices and networks.

According to more general principles of exemplary embodiments disclosed herein, the activation time (Ta) for activating a deactivated second serving cell (e.g., SCell) can depend on the UE receiver activity rate (Rr) used for performing measurements on the SCell at least during time period (T0) before the UE is configured to activate the SCell. More specifically, Ta can be inversely proportional to Rr. In some embodiments, the UE can receive the activity rate Rr (or one or more parameters that are related to Rr and/or from which Rr can be determined) from the network (e.g., the UE's PSC).

Exemplary embodiments disclosed herein relate to a scenario in which a UE configured with at least a first serving cell ("cell1", a primary serving cell (PSC) or PCell) and is further configured to activate a second serving cell (cell2), which can include activating an SCell, adding a PSCell, etc. In the following discussion, the term "activation" can refer to activation of a serving cell, addition of a serving cell, configuration of serving cell, etc. Conversely, the term "deactivation" can refer to deactivation of a serving cell, release of a serving cell, deconfiguration of a serving cell, etc. Examples of serving cells are SCell, PSCell, etc. Accordingly, "activation procedures" can refer to activation (or addition) of SCell, addition of PSCell, etc., while "deactivation procedure" can refer to deactivation of SCell, release of PSCell, etc.

An activation procedure (or, more simply, "activation") for an SCell may be initiated by the network node (e.g., gNB), and be completed by the UE. An exemplary SCell activation may for instance include the network node sending an SCell activation command to the UE. If not already synchronized to the SCell, the UE synchronizes to the SCell and then monitors the PDCCH, determines the channel quality (e.g., CQI), and reports the channel quality back to the network node. A reported non-zero CQI value is indicative that the UE has successfully activated the SCell and, henceforth, can be scheduled in the SCell.

To further illustrate the general principles mentioned above, the relationship between Ta and Rr can be described by:

If Rr is above certain threshold (Gr) then Ta is not larger than Ta1

Else if Rr≤Gr then Ta is larger than Ta1 e.g., Ta=Ta2.

Examples of parameters that can influence and/or determine the UE receiver activity rate (Rr) for measurement on cell2 are serving cell or SCell measurement cycle (Tm), DRX cycle periodicity (Td), DRS occasion periodicity, etc. Examples of Tm are 160, 256, 320, 640, and 1280 ms. Examples of DRX cycles are 10, 40, 80, 160, 320, 640, 1280, and 2560 ms. Examples of DRS occasions and DRS occasion periodicity are SMTC and SMTC period respectively.

In some exemplary embodiments, parameters Tm and Td can be used to enable the UE to reduce its power consumption. The parameter Tm can be configured by the network node and can be used by the UE for scheduling measurements on cells of carrier with deactivated SCell. For example, a UE typically performs measurement on a cell once every measurement cycle (Tm) and/or every DRX cycle (Td). In the context of the above relationship, Rr increases with the decrease in Tm and/or Td.

Consequently, the activation time Ta can also be determined in relation to Tm and/or Td. In one exemplary embodiment, Ta can be determined in relation to Tm and/or Td according to the following:

If Tm is below certain threshold (Gm) then Ta is not larger than Ta1

Else if Tm≥Gm then Ta is larger than Ta1 e.g., Ta=Ta2.

If Td is below certain threshold (Gd) then Ta is not larger than Ta1

Else if Td≥Gd then Ta is larger than Ta1 e.g., Ta=Ta2.

In another exemplary embodiment, Ta can be determined in relation to Tm and Td according to the following:

If F(Tm, Td) is below certain threshold (Gc) then Ta is not larger than Ta1

Else if F(Tm, Td)>=Gc then Ta is larger than Ta1, e.g., Ta=Ta2.

Exemplary F(Tm, Td) can include MAX (Tm, Td), SUM (Tm, Td), AVG(Tm, Td), etc. Exemplary thresholds Gc can be functions g(Gm, Gd), including MAX(Gm, Gd), SUM (Gm, Gd), AVG(Gm, Gd), etc. In the above, Gm is a threshold for measurement cycle and Gd is a threshold for DRX cycle length. For example, when a measurement cycle is below Gm then it can be assumed that the UE receiver activity level is high; otherwise the UE activity can be considered to be low. Similarly, when a DRX cycle length is below Gd then it can be assumed that the UE activity level is high; otherwise the UE activity can be considered to be low. Exemplary durations T0 can include 5 seconds, N1 DRX cycles (e.g., 5), N2 serving cell measurement cycles (e.g., 5), etc.

In another exemplary embodiment, Ta can be determined as a function of at least the number of DRS occasions required by the UE for activating cell1 (N3) and periodicity of such DRS occasions (Ts). For example, Ta=h(N3, Ts, K), where K is the time required by the UE for performing one or more operations including processing the command received from a primary serving cell (cell1) (e.g., PCell) to activate cell2, sending feedback to cell1, UE implementation margin, etc. A specific example of Ta based on the above expression is Ta=K+N3*Ts.

Furthermore, the parameter N3 can also depend on Ts, e.g., N3=h2(Ts). For example, if Ts is smaller than a certain threshold (e.g., GTs) then N3 is below a certain threshold (e.g., GN3); otherwise, N3 is above or equal to GN3. Similarly, the activation times Ta1 and Ta2, discussed above, can also be related to functions of N3, Ts, and K, e.g.:

Ta1=h2(N31,Ts,K) and Ta2=h3(N32,Ts,K), where N32>N31. Specific examples of Ta1 and Ta2 based on the above generalized expression include Ta1=K+N31*Ts and Ta2=K+N32*Ts, where exemplary values can include N31=2 and N32=5 such that Ta1=K+2*Ts and Ta2=K+5*Ts. In such exemplary embodiments, Ta can be determined in relation to Tm according to the following:

If Tm≤640 ms then Ta=Ta1; where N31=2

Else if Tm>640 ms then Ta=Ta2; where N32=5

Based on exemplary values of K=20 ms and Ts=40 ms, Ta1 and Ta2 are 100 ms and 220 ms respectively. In other words, if Tm is up to 640 ms then the UE shall activate cell2 within 100 ms, but if Tm is greater than 640 ms then the UE shall activate cell2 within 220 ms.

In another exemplary embodiment, Ta can be determined in relation to Tm according to the following based on Ta1=K+N31*Ts, Ta2=K+N32*Ts, and Ta2=K+N32*Ts:

If Tm≤256 ms then Ta=Ta1; where N31=2
Else if 256<Tm≤640 ms then Ta=Ta2; where N32=4
Else if Tm>640 ms then Ta=Ta3; where N33=6

Based on exemplary values of K=20 ms and Ts=40 ms, then Ta1, Ta2 and Ta3 are 100, 180, and 260 ms respectively. In other words, if Tm is no more than 256 ms then the UE shall activate cell2 within 100 ms; if Tm is greater than 256 ms but no more than 640 ms, then the UE shall activate cell2 within 180 ms; and if Tm is greater than 640 ms, then the UE shall activate cell2 within 260 ms.

Figure 7:
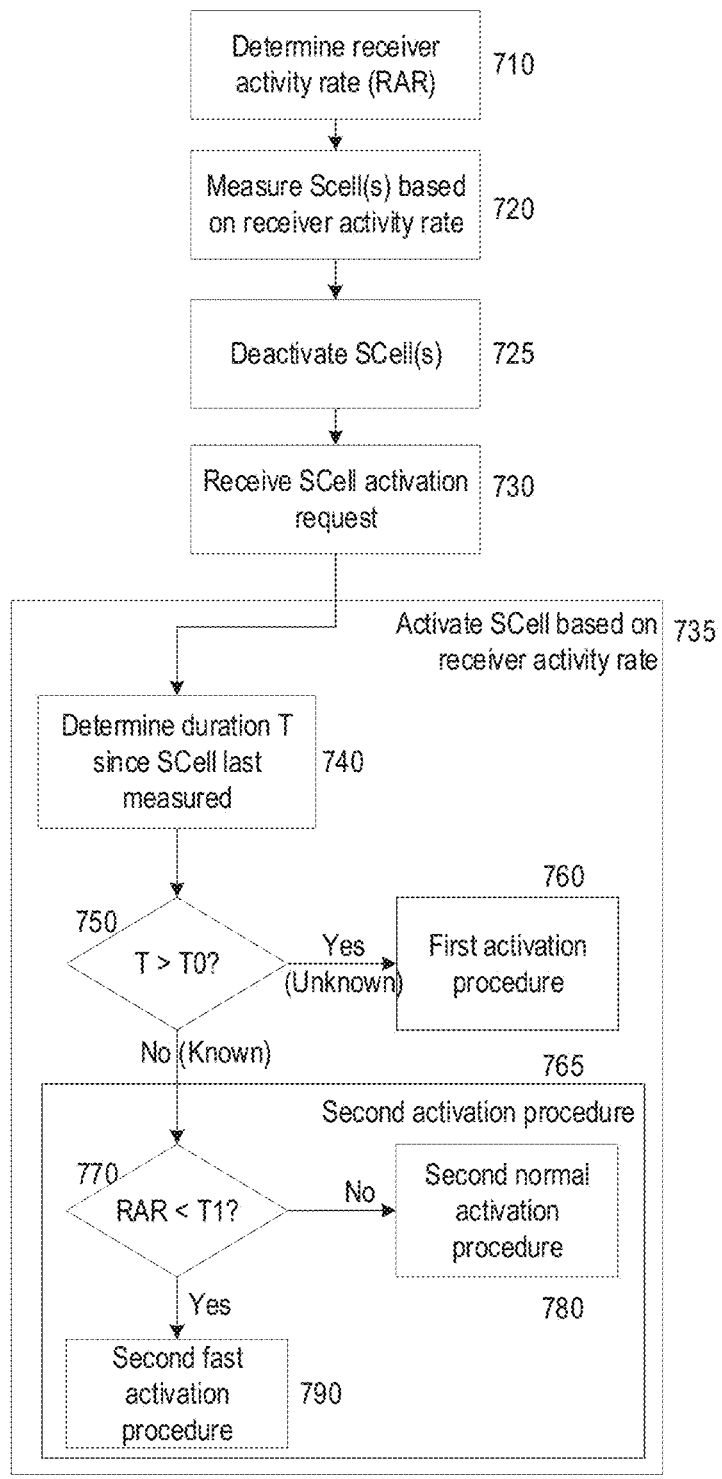
FIG. 7 is a flow diagram of an exemplary method and/or procedure for selecting an SCell activation procedure based on the reliability of a user equipment (UE) gain state, according to one or more exemplary embodiments of the present disclosure.

FIG. 7 is a flow diagram of an exemplary method and/or procedure for activation of a secondary cell (SCell) for operating with a user equipment's (UE's) primary serving cell (PSC) in a wireless network, according to one or more exemplary embodiments of the present disclosure. The exemplary method shown in FIG. 7 can be implemented, for example, in a UE configured according to FIG. 14 (described below). Furthermore, as explained below, the exemplary method and/or procedure shown in FIG. 7 can be utilized cooperatively with the exemplary method and/or procedures shown in FIG. 8 and/or FIG. 13 to achieve exemplary benefits described herein. In addition, although FIG. 7 shows blocks in a particular order, this order is merely exemplary and the operations of the exemplary method and/or procedure can be performed in a different order than shown in FIG. 7, and can be combined and/or divided into blocks having different functionality.

In block 710, the UE can determine a receiver activity rate. For example, the receiver activity rate can be an SCell measurement activity rate parameter, such as Rr described above. In some embodiments, the UE can receive the receiver activity rate (e.g., as a parameter) from a network node (e.g., PCell, controlling PSC, etc.). In some embodiments the UE can receive, from the network node, one or more parameters from which the receiver activity rate can be determined. For example, these one or more parameters can include the following: SCell measurement cycle; discontinuous reception (DRX) cycle periodicity; demodulation reference signal (DRS) occasion periodicity; and SMTC) periodicity.

In some embodiments, the receiver activity rate (or parameters related thereto) can be accompanied by an identification of one or more SCells that should be measured according to the receiver activity rate. In other embodiments, no particular SCells are identified and the UE instead implicitly understands the particular SCells to which the received information applies (e.g., all Scells).

In some embodiments, in block 720, the UE can perform one or more measurements on one or more SCells according to the receiver activity rate. For example, the UE can perform such measurements on SSBs transmitted by each of the one of more SCells. Examples of measurements include cell search, signal quality measurements (e.g., RSRQ, SINR etc.), signal strength measurements (e.g., path loss, RSRP etc.), timing measurements (e.g., SFTD), etc. The operations of block 720 are optional. As such, the UE may not receive, nor perform measurements according to, the receiver activity rate in some exemplary embodiments. In other embodiments, the UE can receive and perform measurements according to the receiver activity rate on some SCells but not on other SCells. In some embodiments, in block 725, the UE can deactivate some or all of the one or more SCells, e.g., based on a deactivation request from the network.

As such, prior to entering block 730, the UE may or may not have previously performed measurements on any particular SCell, with any previous measurements occurring some duration in the past. In block 730, the UE can be configured by a network node (e.g., node serving or controlling PSC) for activating a particular SCell (e.g., cell2) by receiving an SCell activation request via, e.g., a MAC command, an RRC message, a DCI (L) message sent on DL control channel (e.g., PDCCH or ePDCCH), etc. The SCell is preferably deactivated before the UE receives the activation request. Upon receiving the request or shortly thereafter, in block 735, the UE can activate the particular SCell (e.g., cell2) based on the receiver activity rate. In various embodiments, the operations of block 735 can include various operations comprising blocks 740-790, which are described below.

In block 740, the UE can determine a duration (T) since the SCell (e.g., cell2) was last measured. For example, the UE can determine the duration since the last measurement made on cell2 in block 720 according to the receiver activity rate determined in block 710. In block 750, the UE can compare the duration T to a first threshold, T0, to determine if the SCell (e.g., cell2) is "known" or, alternately, "unknown."

For example, the UE can determine that a cell is "unknown" by determining that the SCell has been added (or configured) by the gNB but the UE subsequently has not performed measurements on signals (e.g., SSB) of the SCell at all, or at least within the last T0 time units (e.g., 5 seconds). As such, the UE has no knowledge of the "unknown" SCell's timing and/or the UE is not synchronized with the "unknown" SCell.

Although the primary serving cell (e.g., PCell) and the SCell are typically synchronous, timing differences can arise for several reasons. In the case of non-collocated PCell and SCell, propagation delay differences to the UE's location can introduce an uncertainty (ΔT) of up to ±30 μs in SCell timing relative to the PCell as observed by the UE. The timing difference ΔT at the UE can also depend on NR PHY configuration (e.g., subcarrier spacing) differences between PCell and SCell. Although the above discussion is in terms of PCell/SCell carrier aggregation, similar issues can arise in with respect to PSCells in dual connectivity (DC) configurations.

Alternately, in block 750, the UE can determine that a cell is "known" by determining that measurements have been made on the SCell at least during the last T0 time units (e.g., 5 seconds), such that the UE has some knowledge about proper gain settings. However, depending on DRX or SCell measurement cycles, some time may have passed since last measurement occasion. While this is generally not a problem for RRM measurements, it can impact CSI measurements which are heavily dependent on SINR estimation. For example, timing drift, frequency drift, and/or incorrect gain setting can degrade the SINR estimate considerably.

The first threshold can also be a function of the receiver activity rate and/or parameters related to the receiver activity rate, including the various functions and/or relationships described above. For example, the first threshold can be a function of SCell measurement cycle, DRX cycle periodicity, DRS occasion periodicity, and/or SMTC periodicity.

In block 750, if the UE determines that T is greater than T0 (i.e., the SCell is "unknown"), the exemplary method and/or procedure proceeds to block 760 where the UE can perform a first activation procedure (e.g., a "blind" activation procedure), which is described in more detail below. On the other hand, if the UE determines that duration T is less than T0 (i.e., the SCell is "known"), the exemplary method and/or procedure can proceed to block 765 where the UE can perform a second activation procedure, also described in more detail below.

In various embodiments, the operations of block 765 can include various operations of blocks 770-790, which are described as follows. In block 770, the UE can determine whether the receiver activity rate (abbreviated "RAR" in FIG. 7) is less than a second threshold T1. If the UE determines that RAR is less than T1, then operation proceeds to block 790 where the UE performs a second fast activation procedure, which is described in more detail below. On the other hand, if the UE determines that T is not less than T1 (i.e., T1≤T<T0), then operation proceeds to block 780 where the UE performs a second normal activation procedure, described in more detail below. The fast second activation procedure can have a duration Ta1, and the normal second activation procedure can have a duration Ta2 that is greater than Ta1.

Figure 8:
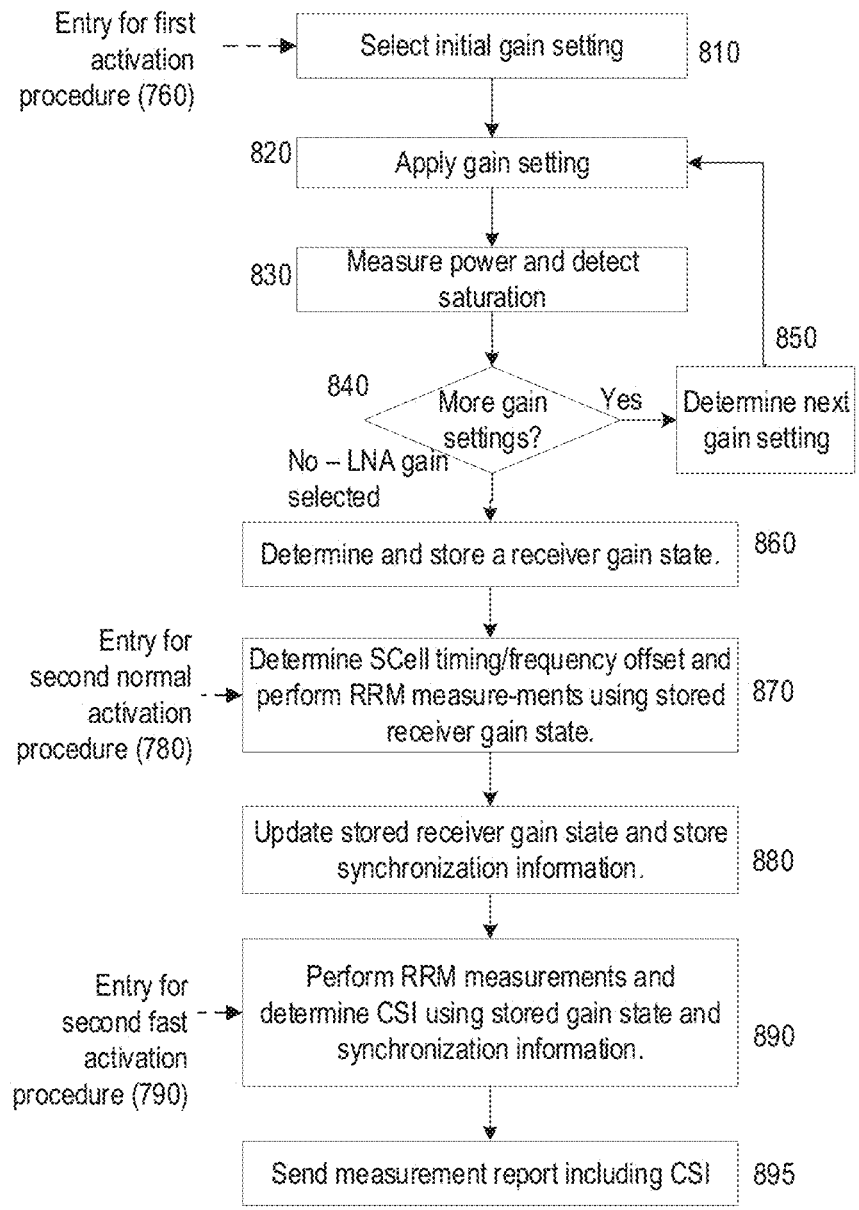
FIG. 8 is a flow diagram of an exemplary method and/or procedure for performing various SCell activation procedures in a UE, according to one or more exemplary embodiments of the present disclosure.

FIG. 8 is a flow diagram of an exemplary method and/or procedure for performing various SCell activation procedures in a UE, according to one or more exemplary embodiments of the present disclosure. The exemplary method shown in FIG. 8 can be implemented, for example, in a user equipment (UE) configured according to FIG. 14 (described below). Furthermore, as explained below, the exemplary method and/or procedure shown in FIG. 8 can be utilized cooperatively with the exemplary method and/or procedures shown in FIG. 7 and/or FIG. 13 to provide various exemplary benefits described herein. In addition, although FIG. 8 shows blocks in a particular order, this order is merely exemplary, and the operations of the exemplary method and/or procedure can be performed in a different order than shown in FIG. 8 and can be combined and/or divided into blocks having different functionality.

The exemplary method and/or procedure shown in FIG. 8 provides three distinct entry points, each corresponding to a particular exit point from the exemplary method and/or procedure shown in FIG. 7. More specifically, the entry point into block 810 corresponds to the "first activation procedure" of block 760; the entry point into block 870 corresponds to the "second normal activation procedure" of block 780; and entry point into block 890 corresponds to the "second fast activation procedure" of block 790. Since the "first activation procedure" (referred to below as "blind activation procedure") includes operations shown in FIG. 8, this procedure will be described first below.

A UE must perform "blind activation" of an SCell if the SCell has been added to the CA (or DC) configuration but the UE has not yet performed measurements of the SCell or the UE has not performed any measurement on signals (e.g., SSB) of SCell for the last T0 time units. At a high level, the "blind activation" procedure includes the operations of determining gain; determining SCell existence; fine-tuning gain and timing/frequency offsets (e.g., synchronization); and determining and reporting CSI (e.g., CQI). The timing of these operations is illustrated by the time-frequency grid shown in FIG. 9, which is referred to in the explanation of FIG. 8 that follows.

When determining a gain setting, an initial operation can be determining a suitable LNA setting, such that signals are properly amplified but without being saturated. Saturation occurs if the gain is too high, and results in clipping of waveforms that in turn introduces distortion and interference of the received signal. Common UE designs use LNAs with two or three operating points, i.e., gain settings. In the former case, the operating points can be referred to high gain and low gain, respectively. In the latter case, they ban be referred to as high gain, mid gain and low gain, respectively. In the following description, three operating points are used, but this is merely exemplary and additional operating points can be used as needed.

In block 810, the UE selects an initial gain setting prior to the initial SSB used for gain determination. The timing of the initial SSB can be determined, e.g., from the PSC (e.g., PCell or PSCell) timing and SCell SMTC information provided by the PSC. SMTC information can include one or more parameters associated with the SMTC configuration. Examples of such parameters are SMTC periodicity, SMTC window size (e.g., number of SSBs), SMTC offset etc.

Figure 9:
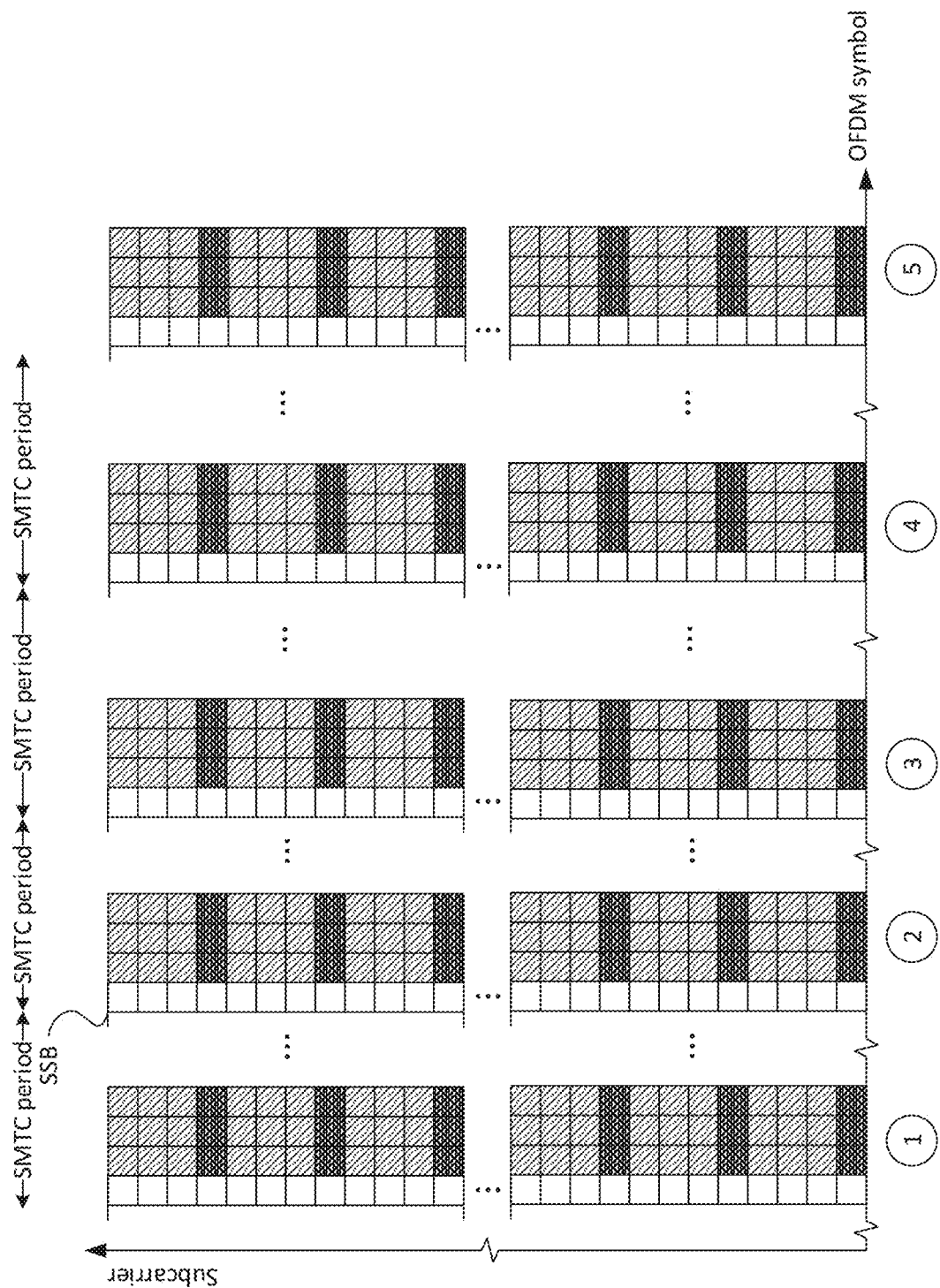
FIG. 9 is an exemplary time-frequency grid illustrating operations of a blind SCell activation procedure, according to one or more exemplary embodiments of the present disclosure.

In block 810, for example, the UE can select a mid-gain setting for the LNA and default unit-gain settings for other amplifiers (e.g., VGA). In block 820, the UE applies the selected gain setting(s) to the particular amplifiers, e.g., by writing one or more control words and/or messages to the respective amplifiers. In block 830, using the applied gain settings, the UE performs one or more power measurements (e.g., RSSI), from which the UE can determine whether the received signal is saturated. In the context of FIG. 9, these power measurements are performed on the first available SSB, labelled ①.

In block 840, the UE determines if there are more gain settings to be examined using power measurements. For example, after applying the initial mid-gain setting, the UE will determine that the low-gain and high-gain settings remain to be examined. In such case, operation proceeds to block 850 where the UE determines the next gain setting to use for power measurements. For example, the gain determination of block 850 can be based on the results of block 830, e.g., whether saturation was detected during reception of the first SSB. If mid-gain resulted in saturation, the UE can determine to use low-gain setting next. Otherwise, the UE can determine to use the high-gain setting.

Operation proceeds to block 820 where the UE applies the newly selected gain setting, and then to block 830, where the UE performs one or more power measurements (e.g., RSSI), from which the UE can determine whether the received signal is saturated. In the context of FIG. 9, these power measurements are performed on the second available SSB, labelled ②. In block 840, the UE again determines if there are more gain settings to be examined using power measurements. For example, if there are more than three gain settings (e.g., four), the UE can determine that one of two remaining gain settings should be examined.

In the case of three gain settings, however, the UE typically needs to examine only two of the three to determine a gain setting that produces a valid operating point without saturation. In such case, in block 840, the UE selects an LNA gain for a valid operating point based on the information it has acquired. For example, if mid-gain resulted in saturation, it selects the low-gain setting. If mid-gain did not result in saturation but high gain did, it selects the mid-gain setting. Otherwise, it selects the high-gain setting.

Subsequently, in block 860, the UE can determine and store a receiver gain state based on performing measurements on another SSB. For example, the UE can fine-tune the selected gain setting by determining gain settings for the VGA, which was previously set to a default unit gain. In the context of FIG. 9, these measurements are performed on the third available SSB, labelled ③. After fine-tuning the gain setting, the UE stores the LNA and VGA gains as a first receiver gain state for the receiver.

In block 870, the UE determines SCell timing and/or frequency offsets (i.e., in relation to the PSC) and performs Radio Resource Management (RRM) measurements using the stored first receiver gain state. In the context of FIG. 9, these operations are performed on the fourth available SSB, labelled ④, with the stored first receiver gain state being retrieved and applied prior to the beginning of this fourth SSB. For example, the UE can determine timing and/or frequency offsets of the requested SCell using PSS, SSS, and/or DM-RS comprising the SSB. After performing such operations, the UE knows the timing offset between PSC and the SCell. In addition, the UE can determine whether the receiver gain needs to be further adjusted based on these received signals. Furthermore, the UE can perform RRM measurements (e.g., RSRP, RSRQ, RS-SINR) to determine the existence of the SCell using, e.g., the SSS and/or DM-RS comprising the SSB.

Figure 10:
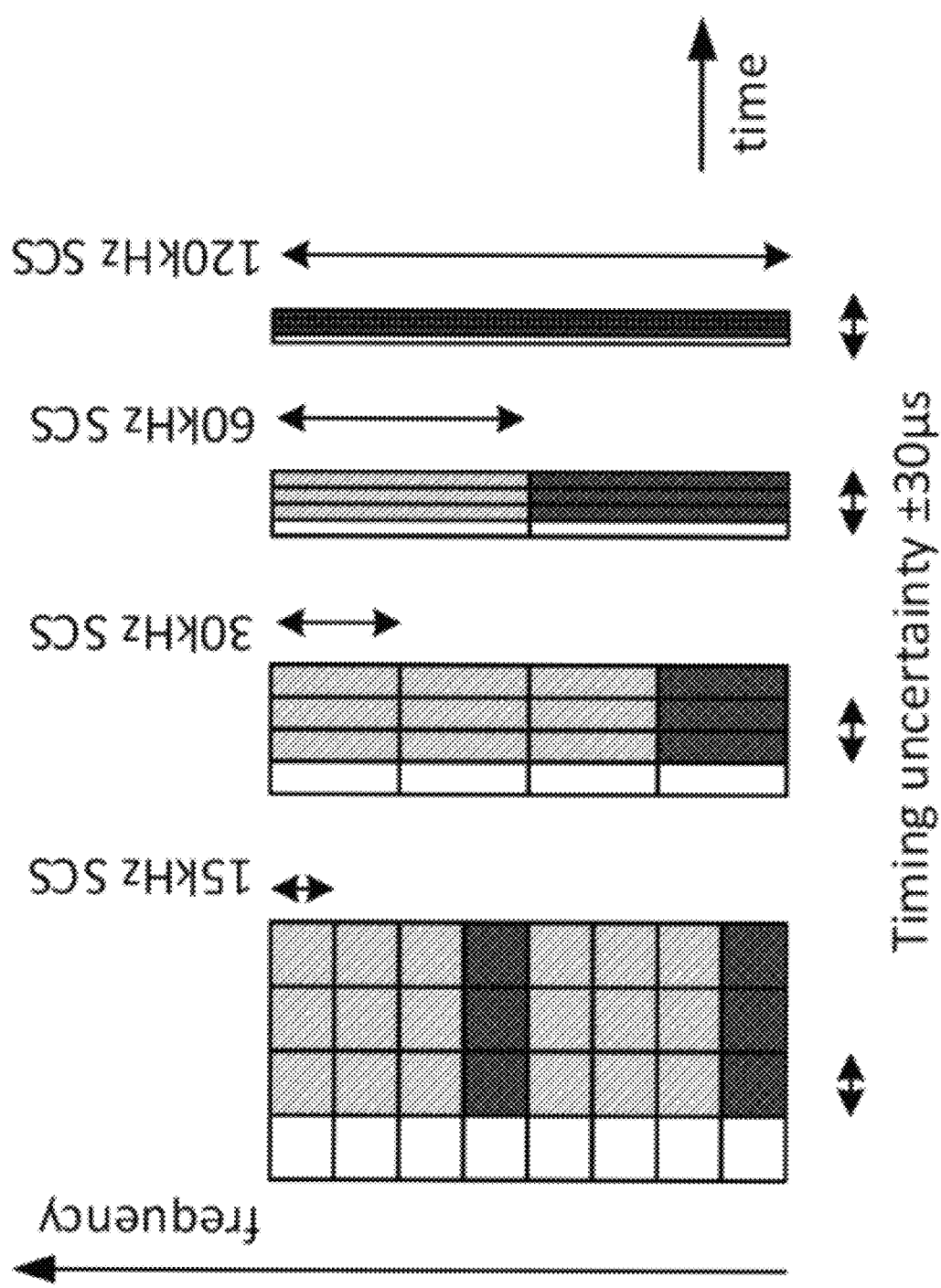
FIG. 10 an exemplary time-frequency grid illustrating SCell timing uncertainty with respect to various subcarrier spacing (SCS), according to one or more exemplary embodiments of the present disclosure.

The UE can determine an SCell timing offset in block 870 using various techniques that can depend on, e.g., the amount of uncertainty in the SCell timing at the beginning of the block-870 operations. In some NR CA/DC scenarios, the amount of SCell timing uncertainty can be ~60 µs (e.g., +/−30 µs) around the nominal position determined from previous measurements. This is illustrated on the horizontal axis of the exemplary time-frequency grid shown in FIG. 10. In such case, the timing offset can be determined by conducting a set of measurements at one or more hypothetical timing offsets covering the range of uncertainty. The individual measurements in the set can be spaced approximately one-half OFDM symbol in time according to receiver capabilities.

The number of measurements in the set depends on the sub-carrier spacing (SCS) in the OFDM symbols, which in turn affects the duration of each OFDM symbols. For example, a 15-kHz SCS results in a symbol duration of $\frac{1}{15}$ kHz or ~66 µs, as shown in the left-most sub-grid in FIG. 10. In such case, only one or two measurements would be required to cover the uncertainty range. In contrast, a 120-kHz SCS results in a symbol duration of 8.25 µs, which requires up to 15 measurements to cover the uncertainty range. In general, the larger the SCS, the more measurements are needed to cover the whole range of potential offsets between PSC (e.g., PCell or PSCell) timing and SCell timing.

After performing such measurements, the UE can select the timing that corresponds to the maximum value within the measured set when determining the suitable gain settings. Furthermore, the UE can use various other techniques for fine-tuning the SCell timing offset determined in this manner. For example, the UE can perform SSS-based matched filtering over radio samples received within the window of uncertainty. After refining the timing offsets in this manner, the UE can perform RRM measurements (e.g., RSRP, RSRQ etc.) by post-processing the same radio samples with the determined timing offset applied.

In block 880, based on the measurements performed and timing and/or frequency offset information determined in block 870, the UE updates the stored first receiver gain state to a second receiver gain state and stores first synchronization information. For example, the first synchronization information can be based on the determined timing and/or frequency offset information. In block 890, the UE uses the stored second receiver gain state and first synchronization information to perform Radio Resource Management (RRM) measurements needed to determine the channel state information (CSI). In the context of FIG. 9, these operations are performed on the fifth available SSB, labelled ⑤. The UE can perform the RRM measurements needed to determine the CSI, for example, using the DM-RS comprising the fifth SSB. The UE can also fine-tune the second receiver gain state and/or first synchronization information based on reception of the fifth SSB, as needed, and store the updated values for future use. For example, the UE can update the second receiver gain state to a third receiver gain state, and/or update the first synchronization information to a second synchronization information. After completing these operations, the UE can send a measurement report to the network (e.g., PSC or PCell) in block 895. The measurement report can include CSI, e.g., a valid (non-zero) CQI value or index.

In contrast to the "blind activation" described above, a UE can perform a "normal activation" of an SCell if that SCell is "known" to the UE but has not been measured during the last T1 time units. As described above, an SCell can be "known" if the UE has performed measurement on signals (e.g., SSB) of the SCell during the last T0 time units (where T0>T1). In other words, "normal activation" can be used when duration since the last measurement of the SCell is between T1 and T0. In such case, that the UE's stored gain settings are likely to meet a minimum accuracy requirement. At a high level, "normal activation" can include fine-tuning the gain settings (e.g., first receiver gain state), determining timing and/or frequency offsets (e.g., synchronization information), and determining and reporting CSI (e.g., CQI).

Figure 11:
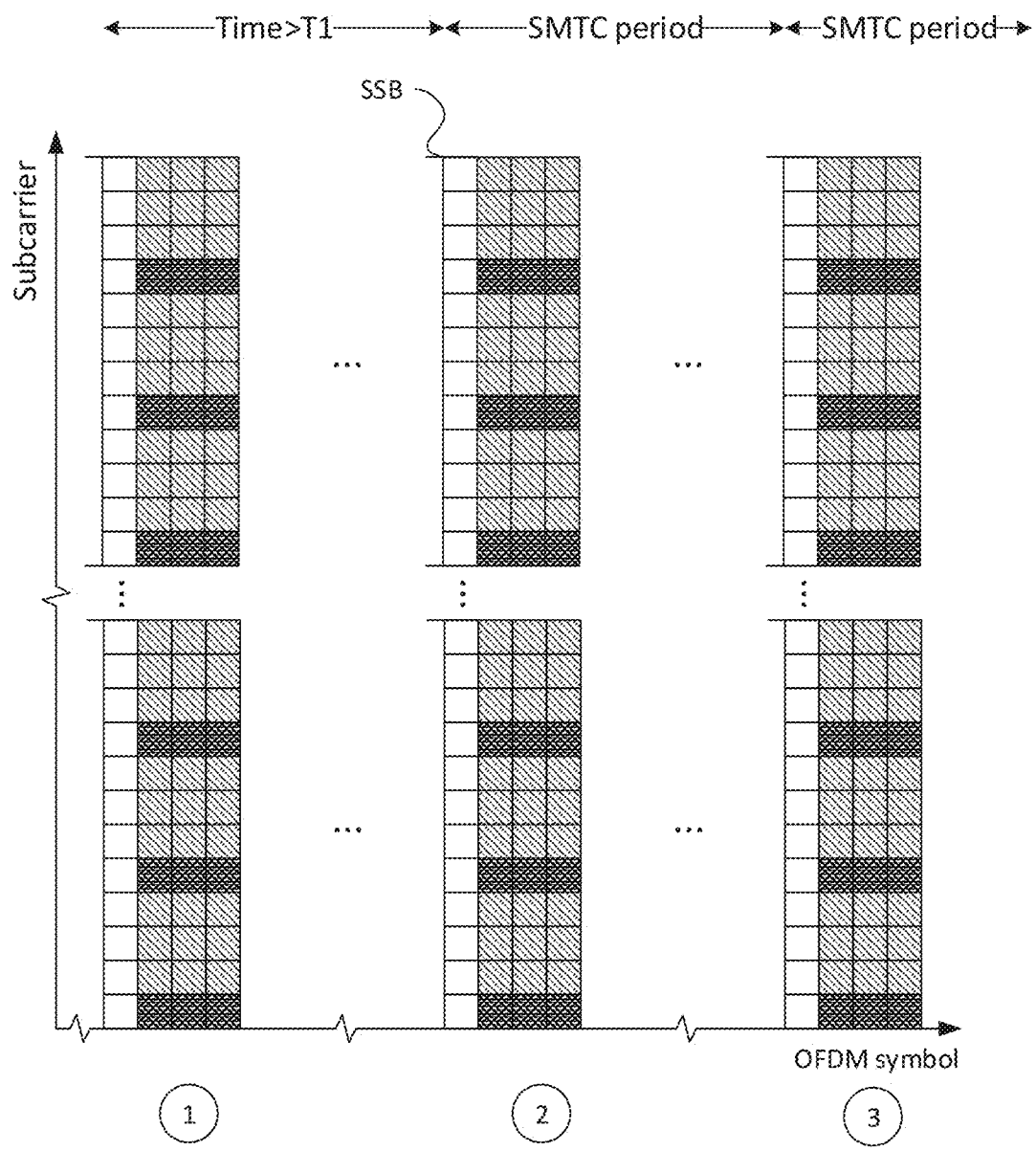
FIG. 11 is an exemplary time-frequency grid illustrating operations of a normal SCell activation procedure, according to one or more exemplary embodiments of the present disclosure.

An exemplary timing of these operations is illustrated by the time-frequency grid shown in FIG. 11. The first SSB, labelled ①, represents the last SSB that the UE measured for the SCell before receiving an SCell activation command, request, and/or message. The UE determines, in block 770 of FIG. 7, that the duration, T, between the most recently measured SSB and the first SSB following the SCell activation command (labelled ② in FIG. 11) exceeds some threshold T1 (e.g., 160 ms). As such, the UE selects the "normal activation procedure" in block 770 of FIG. 7, and then proceeds to block 870 of FIG. 8. In block 870, the UE determines SCell timing/frequency offsets and performs Radio Resource Management (RRM) measurements (using a stored gain state and/or stored coarse timing/frequency offset) based on receiving the SSB labelled ② in FIG. 11. The UE then performs the operations in blocks 880-895 of FIG. 8, as described above with respect to the "blind activation" case.

In contrast to the "blind activation" and "normal activation" described above, a UE can perform a "fast activation" of an SCell if the UE has performed measurement on signals (e.g., SSB) of the SCell during the last T1 time units. In such case, the SCell is "known" and the UE's stored gain settings and/or timing/frequency offsets are likely to meet a higher accuracy requirement. "Fast activation" includes determining and reporting CSI (e.g., CQI).

Figure 12:
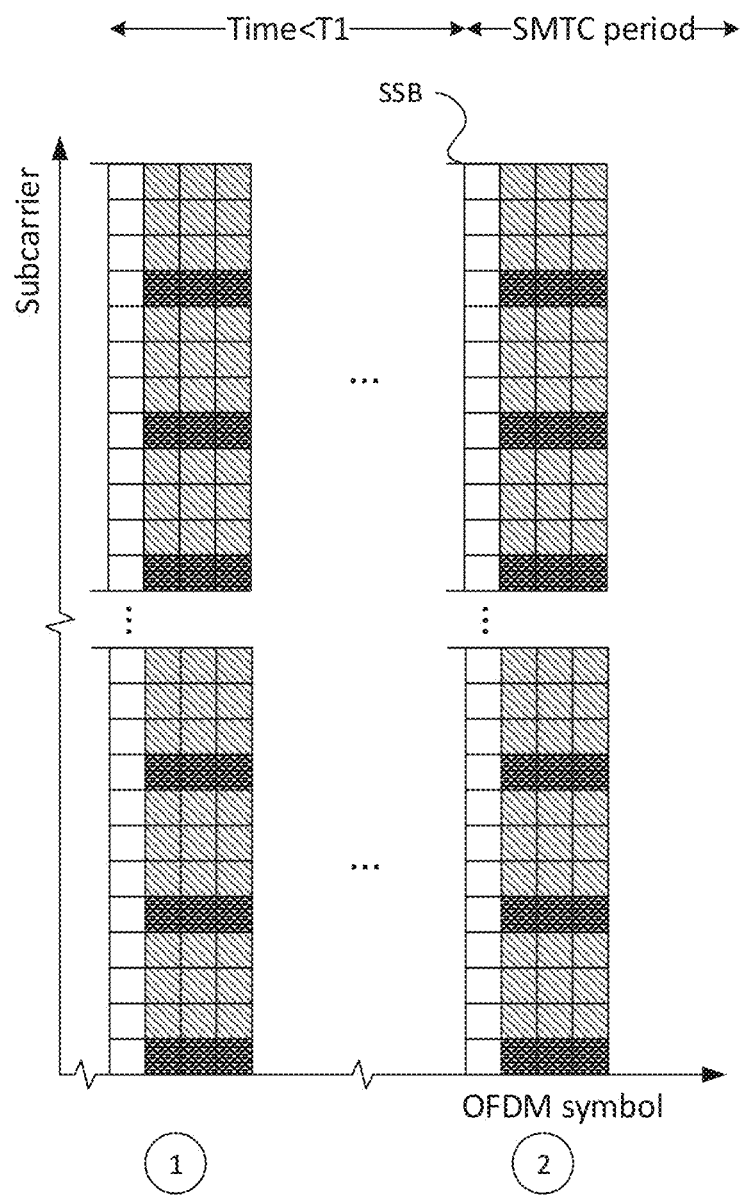
FIG. 12 is an exemplary time-frequency grid illustrating operations of a fast SCell activation procedure, according to one or more exemplary embodiments of the present disclosure.

The timing of these operations is illustrated by the time-frequency grid shown in FIG. 12. The first SSB, labelled ①, represents the last SSB that the UE measured for the SCell before receiving an SCell activation command, request, and/or message. The UE determines, in block 770 of FIG. 7, that the duration, T, between the most recently measured SSB and the first SSB following the SCell activation command (labelled ② in FIG. 12) is less than threshold T1 (e.g., 160 ms). As such, the UE selects the "fast activation procedure" in block 780 of FIG. 7, and then proceeds to block 890 of FIG. 8. The UE then performs the operations in blocks 880-895, described above with respect to the "blind activation" case.

The SCell activation times resulting from the exemplary methods and/or procedures shown in FIGS. 7 and 8 can be represented numerically as shown below, where $T_{P1}$, $T_{P2}$, and $T_{P3}$ represent the activation times of the blind, normal, and fast procedures, respectively:

$$T_{P1} = T_{macProcessing} + T_{activationUncertainty} + 4\text{SMTC} + T_{SSB} + T_{postProcessing} + T_{reportingUncertainty}$$

$$T_{P2} = T_{macProcessing} + T_{activationUncertainty} + 1\text{SMTC} + T_{SSB} + T_{postProcessing} + T_{reportingUncertainty}$$

$$T_{P3} = T_{macProcessing} + T_{activationUncertainty} + T_{SSB} + T_{postProcessing} + T_{reportingUncertainty}$$

where $T_{activationTimeUncertainty}$=1 SMTC Maximum time between activation command and first SSB following upon receiving the command.

$T_{reportingUncertainty}$=X1 ms Maximum time between CSI measurements and available resources on the uplink. For example, X can be 2 ms. X can also depend on the configuration of the UL signals used.

$T_{postProcessing}$=1 ms Headroom for postprocessing for determining CSI;

$T_{macProcessing}$=X2 Time for processing of activation command (MAC). For example, X2 can be 2 ms. X2 can also depend on the configuration of the UL signals used;

$T_{SSB}$=4 OFDM symbols Duration of SSB reception.

Figure 13:
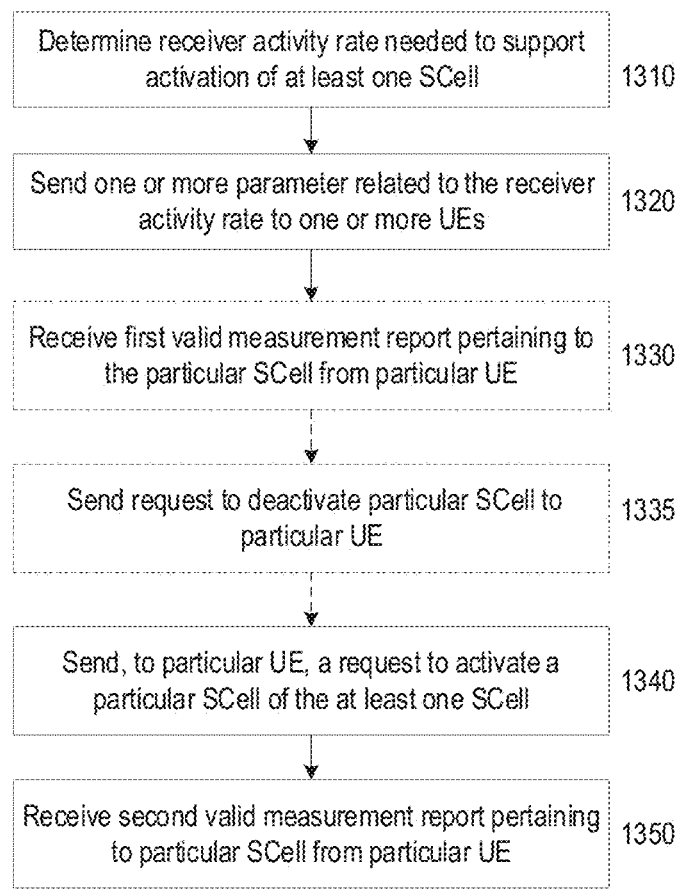
FIG. 13 a flow diagram of an exemplary method and/or procedure for performing various SCell activation procedures in a network node, according to one or more exemplary embodiments of the present disclosure

FIG. 13 shows a flow diagram of an exemplary method and/or procedure for use by a network node (e.g., base station, eNB, gNB, etc., or component thereof) arranged to communicate with one or more user equipment (UEs) via a primary serving cell (PSC) and at least one selectively activated secondary cell (SCell), according to one or more exemplary embodiments of the present disclosure. The exemplary method shown in FIG. 13 can be implemented, for example, in a network node configured according to FIG. 15 (described below). Furthermore, as explained below, the exemplary method and/or procedure shown in FIG. 13 can be utilized cooperatively with the exemplary method and/or procedures shown in FIG. 7 and/or FIG. 8 to provide various exemplary benefits described herein. In addition, although FIG. 13 shows blocks in a particular order, this order is merely exemplary, and the operations of the exemplary method and/or procedure can be performed in a different order than shown in FIG. 13 and can be combined and/or divided into blocks having different functionality.

In block 1310, the network node can determine a receiver activity rate needed to support activation of one or more SCells by one or more UEs served by the network node. For example, the network node may provide the PSC (e.g., PCell or PSCell) for the one or more UEs, as well as one or more SCells that can be activated and/or deactivated for particular ones of the UEs as needed, required, and/or desirable. The receiver activity rate can apply to SCells provided by the network node and/or SCells provided by another network node. In some embodiments, the receiver activity rate can be represented by, or relate to, the parameter Rr discussed above. Moreover, the measurement activity rate can be determined based on a required, optimal, preferred, and/or desired SCell activation time in accordance with the various relationships discussed above.

In block 1320, the network node can send one or more parameters related to the receiver activity rate to one or more UEs served by the network node. The parameter(s) can be sent in various types of messages, using various types of protocols, and/or using various types of bearers (e.g., broadcast, multicast, unicast, etc.). For example, the one or more parameters can include any of the following: SCell measurement cycle; discontinuous reception (DRX) cycle periodicity; demodulation reference signal (DRS) occasion periodicity; and SMTC) periodicity. In some embodiments, the network node can also send identifiers of one or more SCells to which the parameter(s) apply(ies).

In some embodiments, in block 1330, the network node can receive a first valid measurement report pertaining to a particular SCell from a particular UE served by the network node (e.g., by the provided PCell). The measurement report can include measurements made, by the UE, according to the receiver activity rate and/or the one or more related parameters provided in block 1320. In some embodiments, in block 1335, the network node can send a request to deactivate the particular SCell to the particular UE. In any case, before entering block 1340, the particular SCell is deactivated with respect to the particular UE.

Subsequently, in block 1340, the network node can send an SCell activation request to the particular UE. In block 1350, the network node can receive a second valid measurement report from the UE, pertaining to the particular SCell, in response to the activation request sent in block 1330. In some exemplary embodiments, the valid measurement report can comprise valid CSI (e.g., CSI with a non-zero channel quality indicator (CQI)). The valid measurement (e.g., CSI) report can be generated by the UE in various ways, including by the exemplary procedures shown in FIGS. 7 and 8 discussed above.

In some exemplary embodiments, the UE can be configured to first perform a state transition from a deactivated SCell to an intermediate activated SCell, and in the next step the UE can further be configured to perform state transition from the intermediate activated SCell to the activated SCell. The state of the activated SCell is the same as described above with respect to other exemplar embodiments. In the intermediate activated SCell state, the UE is not required to monitor/receive a control channel (e.g., PDCCH, ePDCCH, etc.). But in the activated SCell state (or the normal/legacy SCell activated state), the UE is required to monitor/receive such a control channel.

In both cases, however, the UE is required to report a measurement result (e.g., valid non-zero CQI) as an indication that the SCell is activated. The intermediate activated SCell state may also be referred to as fast activated SCell state, transitionary activated SCell, etc. The intermediate activated SCell state allows the UE to save power while still maintaining synchronization and can be used, e.g., under bursty traffic where the network node does not need to continuously schedule the UE. But the state transition duration from the intermediate activated SCell state to the normal/legacy SCell activation (i.e., when UE can monitor control channel) is much shorter than the state transition duration from the deactivated SCell state to the normal/legacy SCell activation.

According to one aspect of this exemplary embodiment, the time required by the UE to perform state transition from the intermediate SCell activated state to SCell activated state depends on the activity level of the UE with respect to SCell during the time the UE is in the intermediate SCell activated state. For example, if the UE during the intermediate SCell activated state is configured with a measurement reporting periodicity up to a certain threshold (Gc), then the UE is required to activate the SCell (i.e., from the intermediate SCell activate state) within a particular time period (Tx); but if the UE is configured with a measurement reporting periodicity greater than Gc, then the UE is required to activate the SCell within a further time period (Ty), where. For example, Gc can be 160 ms.

When measurement reporting is performed more frequently in the intermediate SCell activation state, the UE already has updated timing information of the SCell. As such, the UE can activate the SCell within a shorter time (e.g., Tx). But when the measurement reporting is done less frequently in the intermediate SCell activation state, the UE may need to refine the timing of the SCell before the UE can fully activate the SCell to begin receiving a control channel (e.g., PDCCH, ePDCCH, etc.). As an example, Tx can be the time to process the received message and transmit the feedback (e.g., an ACK) as an indication that the SCell is activated. For example, Tx can be 8 ms. In the same example, Ty can be the time to process the received message, refine timing of the SCell, and transmit the feedback (e.g., ACK) as an indication that the SCell is activated. For example, Ty can be 8 ms+Tref, where Tref is the duration of one or more slots or subframes (e.g., 2 subframes).

In other words, in some embodiments, a first duration between sending (in block 1340) the request to activate the particular SCell and receiving (in block 1350) the second valid measurement report is a function of the one or more parameters sent to the UE (in block 1320). In some embodiments, when a first valid measurement report was received earlier (e.g., in block 1330), the first duration is also a function of a second duration between receiving the first valid measurement report and sending the request to activate the particular SCell.

For example, if the second duration is greater than a first threshold, T0, that is a function of the receiver activity rate, the first duration can be less than or equal to a first value. Otherwise, the first duration can be less than or equal to a second value that is less than the first value. In some embodiments, if the second duration is less than or equal to T1, the first duration can depend on, or be a function of, the receiver activity rate and/or the related parameters. For example, if the receiver activity rate is greater than a second threshold, T1, the first duration can be less than or equal to the second value, but otherwise less than or equal to a third value, which is less than the second value.

Figure 14:
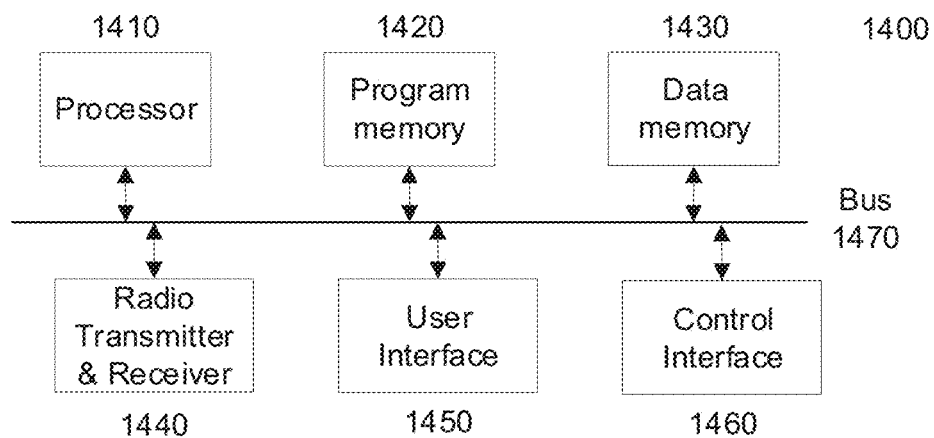
FIG. 14 is a block diagram of an exemplary wireless device or user equipment (UE) configurable according to one or more exemplary embodiments of the present disclosure.

Although various embodiments are described herein above in terms of methods, apparatus, devices, computer-readable medium and receivers, the person of ordinary skill will readily comprehend that such methods can be embodied by various combinations of hardware and software in various systems, communication devices, computing devices, control devices, apparatuses, non-transitory computer-readable media, etc. FIG. 14 shows a block diagram of an exemplary wireless device or user equipment (UE) configurable according to various exemplary embodiments of the present disclosure, including execution of instructions on a computer-readable medium comprising one or more exemplary methods for configuring and/or utilizing a plurality of transmit and/or receive conversion systems according to one or more of the embodiments described herein above.

Exemplary device 1400 can comprise a processor 1410 that can be operably connected to a program memory 1420 and/or a data memory 1430 via a bus 1470 that can comprise parallel address and data buses, serial ports, or other methods and/or structures known to those of ordinary skill in the art. Program memory 1420 comprises software code or program executed by processor 1410 that facilitates, causes and/or programs exemplary device 1400 to communicate using one or more wired or wireless communication protocols, including one or more wireless communication protocols standardized by 3GPP, 3GPP2, or IEEE, such as those commonly known as 5G/NR, LTE, LTE-A, UMTS, HSPA, GSM, GPRS, EDGE, 1xRTT, CDMA2000, 802.11 WiFi, HDMI, USB, Firewire, etc., or any other current or future protocols that can be utilized in conjunction with radio transceiver 1440, user interface 1450, and/or host interface 1460.

For example, processor 1410 can execute program code stored in program memory 1420 that corresponds to MAC, RLC, PDCP, and RRC layer protocols standardized by 3GPP (e.g., for NR and/or LTE). As a further example, processor 1410 can execute program code stored in program memory 1420 that, together with radio transceiver 1440, implements corresponding PHY layer protocols, such as Orthogonal Frequency Division Multiplexing (OFDM), Orthogonal Frequency Division Multiple Access (OFDMA), and Single-Carrier Frequency Division Multiple Access (SC-FDMA).

Program memory 1420 can also comprises software code executed by processor 1410 to control the functions of device 1400, including configuring and controlling various components such as radio transceiver 1440, user interface 1450, and/or host interface 1460. Program memory 1420 can also comprise one or more application programs and/or modules comprising computer-executable instructions embodying any of the exemplary methods and/or procedures described herein. Such software code can be specified or written using any known or future developed programming language, such as e.g., Java, C++, C, Objective C, HTML, XHTML, machine code, and Assembler, as long as the desired functionality, e.g., as defined by the implemented method steps, is preserved. In addition or as an alternative, program memory 1420 can comprise an external storage arrangement (not shown) remote from device 1400, from which the instructions can be downloaded into program memory 1420 located within or removably coupled to device 1400, so as to enable execution of such instructions.

Data memory 1430 can comprise memory area for processor 1410 to store variables used in protocols, configuration, control, and other functions of device 1400, including operations corresponding to, or comprising, any of the exemplary methods and/or procedures described herein. Moreover, program memory 1420 and/or data memory 1430 can comprise non-volatile memory (e.g., flash memory), volatile memory (e.g., static or dynamic RAM), or a combination thereof. Furthermore, data memory 1430 can comprise a memory slot by which removable memory cards in one or more formats (e.g., SD Card, Memory Stick, Compact Flash, etc.) can be inserted and removed. Persons of ordinary skill in the art will recognize that processor 1410 can comprise multiple individual processors (including, e.g., multi-core processors), each of which implements a portion of the functionality described above. In such cases, multiple individual processors can be commonly connected to program memory 1420 and data memory 1430 or individually connected to multiple individual program memories and or data memories. More generally, persons of ordinary skill in the art will recognize that various protocols and other functions of device 1400 can be implemented in many different computer arrangements comprising different combinations of hardware and software including, but not limited to, application processors, signal processors, general-purpose processors, multi-core processors, ASICs, fixed and/or programmable digital circuitry, analog baseband circuitry, radio-frequency circuitry, software, firmware, and middleware.

A radio transceiver 1440 can comprise radio-frequency transmitter and/or receiver functionality that facilitates the device 1400 to communicate with other equipment supporting like wireless communication standards and/or protocols. In some exemplary embodiments, the radio transceiver 1440 includes a transmitter and a receiver that enable device 1400 to communicate with various 5G/NR networks according to various protocols and/or methods proposed for standardization by 3GPP and/or other standards bodies. For example, such functionality can operate cooperatively with processor 1410 to implement a PHY layer based on OFDM, OFDMA, and/or SC-FDMA technologies, such as described herein with respect to other figures. In some exemplary embodiments, the radio transceiver 1440 can comprise some or all of the receiver functionality shown in and described above with reference to FIG. 5.

In some exemplary embodiments, the radio transceiver 1440 includes an LTE transmitter and receiver that can facilitate the device 1400 to communicate with various LTE LTE-Advanced (LTE-A), and/or NR networks according to standards promulgated by 3GPP. In some exemplary embodiments of the present disclosure, the radio transceiver 1440 includes circuitry, firmware, etc. necessary for the device 1400 to communicate with various 5G/NR, LTE, LTE-A, UMTS, and/or GSM/EDGE networks, also according to 3GPP standards. In some exemplary embodiments of the present disclosure, radio transceiver 1440 includes circuitry, firmware, etc. necessary for the device 1400 to communicate with various CDMA2000 networks, according to 3GPP2 standards.

In some exemplary embodiments of the present disclosure, the radio transceiver 1440 is capable of communicating using radio technologies that operate in unlicensed frequency bands, such as IEEE 802.11 WiFi that operates using frequencies in the regions of 2.4, 5.6, and/or 60 GHz. In some exemplary embodiments of the present disclosure, radio transceiver 1440 can comprise a transceiver that is capable of wired communication, such as by using IEEE 802.3 Ethernet technology. The functionality particular to each of these embodiments can be coupled with or controlled by other circuitry in the device 1400, such as the processor 1410 executing program code stored in program memory 1420 in conjunction with, or supported by, data memory 1430.

User interface 1450 can take various forms depending on the particular embodiment of device 1400, or can be absent from device 1400 entirely. In some exemplary embodiments, user interface 1450 can comprise a microphone, a loudspeaker, slidable buttons, depressable buttons, a display, a touchscreen display, a mechanical or virtual keypad, a mechanical or virtual keyboard, and/or any other user-interface features commonly found on mobile phones. In other embodiments, the device 1400 can comprise a tablet computing device including a larger touchscreen display. In such embodiments, one or more of the mechanical features of the user interface 1450 can be replaced by comparable or functionally equivalent virtual user interface features (e.g., virtual keypad, virtual buttons, etc.) implemented using the touchscreen display, as familiar to persons of ordinary skill in the art. In other embodiments, the device 1400 can be a digital computing device, such as a laptop computer, desktop computer, workstation, etc. that comprises a mechanical keyboard that can be integrated, detached, or detachable depending on the particular exemplary embodiment. Such a digital computing device can also comprise a touch screen display. Many exemplary embodiments of the device 1400 having a touch screen display are capable of receiving user inputs, such as inputs related to exemplary methods and/or procedures described herein or otherwise known to persons of ordinary skill in the art.

In some exemplary embodiments of the present disclosure, device 1400 can comprise an orientation sensor, which can be used in various ways by features and functions of device 1400. For example, the device 1400 can use outputs of the orientation sensor to determine when a user has changed the physical orientation of the device 1400's touch screen display. An indication signal from the orientation sensor can be available to any application program executing on the device 1400, such that an application program can change the orientation of a screen display (e.g., from portrait to landscape) automatically when the indication signal indicates an approximate 90-degree change in physical orientation of the device. In this exemplary manner, the application program can maintain the screen display in a manner that is readable by the user, regardless of the physical orientation of the device. In addition, the output of the orientation sensor can be used in conjunction with various exemplary embodiments of the present disclosure.

A control interface 1460 of the device 1400 can take various forms depending on the particular exemplary embodiment of device 1400 and of the particular interface requirements of other devices that the device 1400 is intended to communicate with and/or control. For example, the control interface 1460 can comprise an RS-232 interface, an RS-485 interface, a USB interface, an HDMI interface, a Bluetooth interface, an IEEE 14144 ("Firewire") interface, an I$^2$C interface, a PCMCIA interface, or the like. In some exemplary embodiments of the present disclosure, control interface 1460 can comprise an IEEE 802.3 Ethernet interface such as described above. In some exemplary embodiments of the present disclosure, the control interface 1460 can comprise analog interface circuitry including, for example, one or more digital-to-analog (D/A) and/or analog-to-digital (A/D) converters.

Persons of ordinary skill in the art can recognize the above list of features, interfaces, and radio-frequency communication standards is merely exemplary, and not limiting to the scope of the present disclosure. In other words, the device 1400 can comprise more functionality than is shown in FIG. 14 including, for example, a video and/or still-image camera, microphone, media player and/or recorder, etc. Moreover, radio transceiver 1440 can include circuitry necessary to communicate using additional radio-frequency communication standards including Bluetooth, GPS, and/or others. Moreover, the processor 1410 can execute software code stored in the program memory 1420 to control such additional functionality. For example, directional velocity and/or position estimates output from a GPS receiver can be available to any application program executing on the device 1400, including various exemplary methods and/or computer-readable media according to various exemplary embodiments of the present disclosure.

Figure 15:
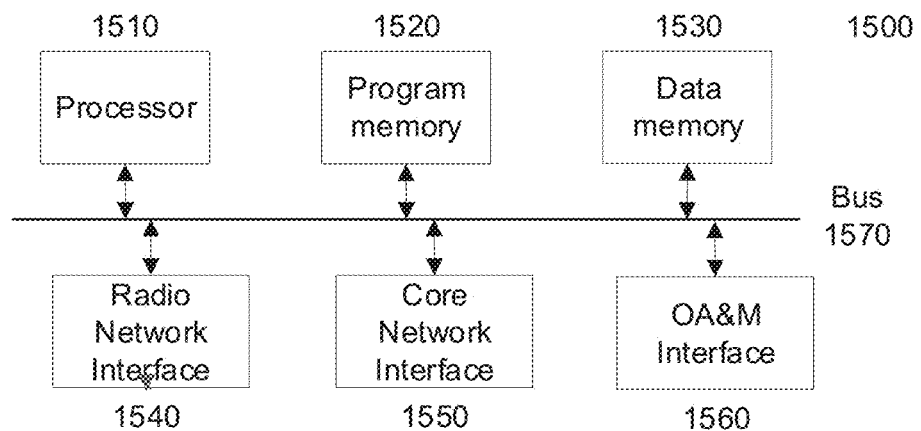
FIG. 15 is a block diagram of an exemplary network node (e.g., a base station, eNB, or gNB) configurable according to one or more exemplary embodiments of the present disclosure.

FIG. 15 shows a block diagram of an exemplary network node 1500 configurable according to various embodiments of the present disclosure, including those described above with reference to other figures. In some exemplary embodiments, network node 1500 can comprise a base station, eNB, gNB, or component thereof. Network node 1500 comprises processor 1510 which is operably connected to program memory 1520 and data memory 1530 via bus 1570, which can comprise parallel address and data buses, serial ports, or other methods and/or structures known to those of ordinary skill in the art. In some exemplary embodiments, processor 1510 can comprise some or all of the functionality of processor 500 shown in FIG. 5 and discussed in more detail above.

Program memory 1520 comprises software code (e.g., program instructions) executed by processor 1510 that can configure and/or facilitate network node 1500 to communicate with one or more other devices using protocols according to various embodiments of the present disclosure, including one or more exemplary methods and/or procedures discussed above. Program memory 1520 can also comprise software code executed by processor 1510 that can facilitate and specifically configure network node 1500 to communicate with one or more other devices using other protocols or protocol layers, such as one or more of the PHY, MAC, RLC, PDCP, and RRC layer protocols standardized by 3GPP for LTE, LTE-A, and/or NR, or any other higher-layer protocols utilized in conjunction with radio network interface 1540 and core network interface 1550. By way of example and without limitation, core network interface 1550 can comprise the SI interface and radio network interface 1550 can comprise the Uu interface, as standardized by 3GPP. Program memory 1520 can further comprise software code executed by processor 1510 to control the functions of network node 1500, including configuring and controlling various components such as radio network interface 1540 and core network interface 1550.

Data memory 1530 can comprise memory area for processor 1510 to store variables used in protocols, configuration, control, and other functions of network node 1500. As such, program memory 1520 and data memory 1530 can comprise non-volatile memory (e.g., flash memory, hard disk, etc.), volatile memory (e.g., static or dynamic RAM), network-based (e.g., "cloud") storage, or a combination thereof. Persons of ordinary skill in the art will recognize that processor 1510 can comprise multiple individual processors (not shown), each of which implements a portion of the functionality described above. In such case, multiple individual processors may be commonly connected to program memory 1520 and data memory 1530 or individually connected to multiple individual program memories and/or data memories. More generally, persons of ordinary skill in the art will recognize that various protocols and other functions of network node 1500 may be implemented in many different combinations of hardware and software including, but not limited to, application processors, signal processors, general-purpose processors, multi-core processors, ASICs, fixed digital circuitry, programmable digital circuitry, analog baseband circuitry, radio-frequency circuitry, software, firmware, and middleware.

Radio network interface 1540 can comprise transmitters, receivers, signal processors, ASICs, antennas, beamforming units, and other circuitry that enables network node 1500 to communicate with other equipment such as, in some embodiments, a plurality of compatible user equipment (UE). In some exemplary embodiments, radio network interface can comprise various protocols or protocol layers, such as the PHY, MAC, RLC, PDCP, and RRC layer protocols standardized by 3GPP for LTE, LTE-A, and/or 5G/NR; improvements thereto such as described herein above; or any other higher-layer protocols utilized in conjunction with radio network interface 1540. According to further exemplary embodiments of the present disclosure, the radio network interface 1540 can comprise a PHY layer based on OFDM, OFDMA, and/or SC-FDMA technologies. In some embodiments, the functionality of such a PHY layer can be provided cooperatively by radio network interface 1540 and processor 1510 (including program code in memory 1520).

Core network interface 1550 can comprise transmitters, receivers, and other circuitry that enables network node 1500 to communicate with other equipment in a core network such as, in some embodiments, circuit-switched (CS) and/or packet-switched Core (PS) networks. In some embodiments, core network interface 1550 can comprise the SI interface standardized by 3GPP. In some exemplary embodiments, core network interface 1550 can comprise one or more interfaces to one or more SGWs, MMEs, SGSNs, GGSNs, and other physical devices that comprise functionality found in GERAN, UTRAN, E-UTRAN, and CDMA2000 core networks that are known to persons of ordinary skill in the art. In some embodiments, these one or more interfaces may be multiplexed together on a single physical interface. In some embodiments, lower layers of core network interface 1550 can comprise one or more of asynchronous transfer mode (ATM), Internet Protocol (IP)-over-Ethernet, SDH over optical fiber, T1/E1/PDH over a copper wire, microwave radio, or other wired or wireless transmission technologies known to those of ordinary skill in the art.

OA&M interface 1560 can comprise transmitters, receivers, and other circuitry that enables network node 1500 to communicate with external networks, computers, databases, and the like for purposes of operations, administration, and maintenance of network node 1500 or other network equipment operably connected thereto. Lower layers of OA&M interface 1560 can comprise one or more of asynchronous transfer mode (ATM), Internet Protocol (IP)-over-Ethernet, SDH over optical fiber, T1/E1/PDH over a copper wire, microwave radio, or other wired or wireless transmission technologies known to those of ordinary skill in the art. Moreover, in some embodiments, one or more of radio network interface 1540, core network interface 1550, and OA&M interface 1560 may be multiplexed together on a single physical interface, such as the examples listed above.

Figure 16:
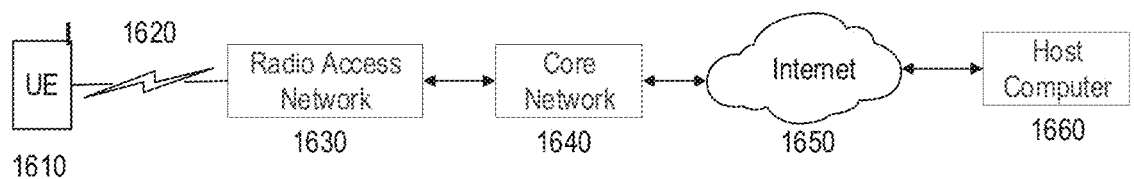
FIG. 16 is a block diagram of an exemplary network configuration usable to provide over-the-top (OTT) data services between a host computer and a user equipment, according to one or more exemplary embodiments of the present disclosure.

FIG. 16 is a block diagram of an exemplary network configuration usable to provide over-the-top (OTT) data services between a host computer and a user equipment (UE), according to one or more exemplary embodiments of the present disclosure. UE 1610 can communicate with radio access network (RAN) 1630 over radio interface 1620, which can be based on protocols described above including, e.g., LTE, LTE-A, and 5G/NR. RAN 1630 can include one or more network nodes (e.g., base stations, eNBs, gNBs, controllers, etc.). RAN 1630 can further communicate with core network 1640 according to various protocols and interfaces described above. For example, one or more apparatus (e.g., base stations, eNBs, gNBs, etc.) comprising RAN 1630 can communicate to core network 1640 via core network interface 1450 described above. In some exemplary embodiments, RAN 1630 and core network 1640 can be configured and/or arranged as shown in other figures discussed above. Similarly, UE 1610 can also be configured and/or arranged as shown in other figures discussed above.

Core network 1640 can further communicate with an external packet data network, illustrated in FIG. 16 as Internet 1650, according to various protocols and interfaces known to persons of ordinary skill in the art. Many other devices and/or networks can also connect to and communicate via Internet 1650, such as exemplary host computer 1660. In some exemplary embodiments, host computer 1660 can communicate with UE 1610 using Internet 1650, core network 1640, and RAN 1630 as intermediaries. Host computer 1660 can be a server (e.g., an application server) under ownership and/or control of a service provider. Host computer 1660 can be operated by the OTT service provider or by another entity on the service provider's behalf.

For example, host computer 1660 can provide an over-the-top (OTT) packet data service to UE 1610 using facilities of core network 1640 and RAN 1630, which can be unaware of the routing of an outgoing/incoming communication to/from host computer 1660. Similarly, host computer 1660 can be unaware of routing of a transmission from the host computer to the UE, e.g., the routing of the transmission through RAN 1630. Various OTT services can be provided using the exemplary configuration shown in FIG. 16 including, e.g., streaming (unidirectional) audio and/or video from host computer to UE, interactive (bidirectional) audio and/or video between host computer and UE, interactive messaging or social communication, interactive virtual or augmented reality, etc.

The exemplary network shown in FIG. 16 can also include measurement procedures and/or sensors that monitor network performance metrics including data rate, latency and other factors that are improved by exemplary embodiments disclosed herein. The exemplary network can also include functionality for reconfiguring the link between the endpoints (e.g., host computer and UE) in response to variations in the measurement results. Such procedures and functionalities are known and practiced; if the network hides or abstracts the radio interface from the OTT service provider, measurements can be facilitated by proprietary signaling between the UE and the host computer.

Exemplary embodiments that improve the performance of SCell activation in CA and DC, as described herein, can play a critical role by enabling UE 1610 and RAN 1630 to meet the requirements of the particular OT service between host computer 1660 and UE 1610. Reducing activation time for NR SCells (e.g., an average activation time) provides more robust resource utilization and/or scheduling in the PSCs (e.g., PCells and/or PSCells) and SCells provided by an NR gNB. By enabling a network to promptly activate and deactivate SCells according to needs of users, these techniques improve data throughput in a coverage area and enable a greater number of users to utilize data-intensive services such as streaming video in various coverage conditions without excessive power consumption or other degradations to user experience.

As described herein, device and/or apparatus can be represented by a semiconductor chip, a chipset, or a (hardware) module comprising such chip or chipset; this, however, does not exclude the possibility that a functionality of a device or apparatus, instead of being hardware implemented, be implemented as a software module such as a computer program or a computer program product comprising executable software code portions for execution or being run on a processor. Furthermore, functionality of a device or apparatus can be implemented by any combination of hardware and software. A device or apparatus can also be regarded as an assembly of multiple devices and/or apparatuses, whether functionally in cooperation with or independently of each other. Moreover, devices and apparatuses can be implemented in a distributed fashion throughout a system, so long as the functionality of the device or apparatus is preserved. Such and similar principles are considered as known to a skilled person.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures that, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and exemplary embodiments thereof, can be used synonymously in certain instances, including, but not limited to, e.g., data and information. It should be understood that, while these words and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

Exemplary embodiments of the present disclosure include, but are not limited to, the following enumerated embodiments.

1. A method used by a user equipment (UE) to determine channel state information (CSI) for activation of a secondary cell (SCell) for operating with the UE's primary serving cell (PSC) in a wireless network, the method comprising:
   receiving, from the PSC, an activation request identifying the SCell;
   determining the duration (T) since the UE's last measurement of a signal block transmitted by the SCell;
   determining whether the duration is greater than or equal to a first threshold (T0);
   when the duration is greater than or equal to the first threshold, performing a blind activation procedure to determine the CSI;
   otherwise, determining whether the duration is less than a second threshold (T1);
   when the duration is less than the second threshold, performing a fast activation procedure to determine the CSI; and
   otherwise, performing a normal activation procedure to determine the CSI.

2. The method of embodiment 1, further comprising sending the CSI to the PSC.

3. The method of any of embodiments 1 through 2, further comprising:
   receiving an SCell measurement activity rate parameter from the PSC; and
   based on the activity rate parameter, performing one or more measurements on signal blocks transmitted by the SCell.

4. The method of any of embodiments 1 through 3, wherein the blind activation procedure comprises determining a first gain state, corresponding to the SCell, for a receiver comprising the UE by:
   measuring power and detecting measurement saturation in each of one or more signal blocks transmitted by the SCell, each signal block being received using one of a plurality of gain settings for a first amplifier;
   based on the power measurements and saturation detection, selecting one of the plurality of gain settings;
   measuring power in a further signal block transmitted by the SCell, the further signal block being received using the selected gain setting for the first amplifier;
   based on the power measured in the further signal block, determining a gain setting for a second amplifier; and storing the selected gain setting for the first amplifier and the determined gain setting for the second amplifier as the first gain state for the receiver corresponding to the SCell.

5. The method of embodiment 4, wherein the blind activation procedure further comprises performing a normal activation procedure using the stored first gain state and the stored first synchronization information.

6. The method of any of embodiments 1 through 5, wherein the normal activation procedure comprises:
applying a first gain state and first stored synchronization information, both corresponding to the SCell, to a receiver comprising the UE;
based on the applied first gain state and first synchronization information, performing one or more first measurements on a first signal block transmitted by the SCell; and
based on the first measurements:
updating the first gain state to a second gain state; and
updating the first synchronization information to second synchronization information.

7. The method of embodiment 6, wherein:
performing one or more first measurements on a first signal block transmitted by the SCell comprises:
performing at least one first measurement at each of one or more timing offsets covering a range of SCell timing uncertainty; and
selecting a particular one of the timing offsets that corresponds to the maximum first measurement for the respective timing offsets;
updating the first synchronization information to the second synchronization information is based on the selected timing offset; and
updating the first gain state to the second gain state is based on the maximum first measurement corresponding to the selected timing offset.

8. The method of any of embodiments 6 and 7, wherein the normal activation procedure further comprises performing a fast activation procedure using the second gain state and the second synchronization information.

9. The method of any of embodiments 1 through 8, wherein the fast activation procedure comprises:
applying the second gain state and the second synchronization information to the receiver;
based on the applied second gain state and second synchronization information, performing one or more second measurements on a second signal block transmitted by the SCell; and
determining the CSI based on the one or more second measurements.

10. The method of embodiment 9, wherein the fast activation procedure further comprises updating at least one of the second gain state and the stored synchronization information based on the one or more second measurements.

11. The method of any of the embodiments 1-10, where PSC is one of a primary cell (PCell) and a primary secondary cell (PSCell).

12. A method used by a network node arranged to communicate with one or more user equipment (UEs) via a primary serving cell (PSC) and at least one selectively activated secondary cell (SCell), the method comprising:
determining an SCell measurement activity rate needed to support activation of one or more SCells by the one or more UEs;
sending a parameter representing the SCell measurement activity rate to the one or more UEs;
sending, to a particular UE of the one or more UEs, a request to activate a particular SCell covered by the parameter representing the SCell measurement activity rate; and
receiving, from the particular UE, a valid measurement report pertaining to the particular SCell.

13. A user equipment (UE) configured to determine channel state information (CSI) for activation of a secondary cell (SCell) for operating with the UE's primary serving cell (PSC) in a wireless network, the UE comprising:
a radio transceiver;
at least one processor; and
at least one memory storing program instructions that, when executed by the at least one processor, configure the UE to:
receive, from the PCell, an activation request identifying the SCell;
determine the duration (T) since the UE's last measurement of the SCell;
determine whether the duration is greater than or equal to a first threshold (T0);
when the duration is greater than or equal to the first threshold, perform a blind activation procedure to determine the CSI;
otherwise, determine whether the duration is less than a second threshold (T1);
when the duration is less than the second threshold, perform a fast activation procedure to determine the CSI; and
otherwise, perform a normal activation procedure to determine the CSI (780).

14. The user equipment (UE) of embodiment 13, wherein execution of the instructions further configures the UE to send the CSI to the PSC.

15. The user equipment (UE) of any of embodiments 13 through 14, wherein execution of the instructions further configures the UE to:
receive an SCell measurement activity rate parameter from the PCell; and
based on the activity rate parameter, perform one or more measurements on signal blocks transmitted by the SCell.

16. The user equipment (UE) of any of embodiments 13 through 15, wherein execution of the instructions further configures the UE to perform the blind activation procedure by determining a first gain state, corresponding to the SCell, for a receiver comprising the UE by:
measuring power and detecting measurement saturation in each of one or more signal blocks transmitted by the SCell, each signal block being received using one of a plurality of gain settings for a first amplifier;
based on the power measurements and saturation detection, selecting one of the plurality of gain settings;
measuring power in a further signal block transmitted by the SCell, the further signal block being received using the selected gain setting for the first amplifier;
based on the power measured in the further signal block, determining a gain setting for a second amplifier; and
storing the selected gain setting for the first amplifier and the determined gain setting for the second amplifier as the first gain state for the receiver corresponding to the SCell.

17. The user equipment (UE) of embodiment 16, wherein execution of the instructions further configures the UE to perform the blind activation procedure by performing a normal activation procedure using the stored first gain state and the stored first synchronization information.

18. The user equipment (UE) of any of embodiments 13 through 17, wherein execution of the instructions further configures the UE to perform the normal activation procedure by:
  applying a first gain state and first stored synchronization information, both corresponding to the SCell, to a receiver comprising the UE;
  based on the applied first gain state and first synchronization information, performing one or more first measurements on a first signal block transmitted by the SCell; and
  based on the first measurements:
    updating the first gain state to a second gain state; and
    updating the first synchronization information to second synchronization information.

19. The user equipment (UE) of embodiment 18, wherein execution of the instructions further configures the UE to perform the one or more first measurements on the first signal block transmitted by the SCell by:
  performing at least one first measurement at each of one or more timing offsets covering a range of SCell timing uncertainty; and
  selecting a particular one of the timing offsets that corresponds to the maximum first measurement for the respective timing offsets;
  updating the first synchronization information to the second synchronization information is based on the selected timing offset; and
  updating the first gain state to the second gain state is based on the maximum first measurement corresponding to the selected timing offset.

20. The method of any of embodiments 18 and 19, wherein execution of the instructions further configures the UE to perform the normal activation procedure by performing a fast activation procedure using the second gain state and the second synchronization information.

21. The method of any of embodiments 13 through 20, wherein execution of the instructions further configures the UE to perform the fast activation procedure by:
  applying the second gain state and the second synchronization information to the receiver;
  based on the applied second gain state and second synchronization information, performing one or more second measurements on a second signal block transmitted by the SCell; and
  determining the CSI based on the one or more second measurements.

22. The user equipment (UE) of embodiment 21, wherein execution of the instructions further configures the UE to perform the fast activation procedure by updating at least one of the second gain state and the stored synchronization information based on the one or more second measurements.

23. The user equipment (UE) of any of the embodiments 13 through 22, where PSC is one of a primary cell (PCell) and a primary secondary cell (PSCell).

24. A network node arranged to communicate with one or more user equipment (UEs) via a primary serving cell (PSC) and at least one selectively activated secondary cell (SCell), the network node comprising:
  a radio interface;
  at least one processor; and
  at least one memory storing program instructions that, when executed by the at least one processor, configure the network node to:
    determine an SCell measurement activity rate needed to support activation of one or more SCells by the one or more UEs;
    send a parameter representing the SCell measurement activity rate to the one or more UEs;
    send, to a particular UE of the one or more UEs, a request to activate a particular SCell covered by the parameter representing the SCell measurement activity rate; and
    receive, from the particular UE, a valid measurement report pertaining to the particular SCell.

25. A non-transitory, computer-readable medium storing program instructions that, when executed by at least one processor, configures a user equipment (UE) to determine channel state information (CSI) for activation of a secondary cell (SCell) for operating with the UE's primary serving cell (PCell) in a wireless network, by performing the operations corresponding to the methods of any of embodiments 1 through 11.

26. A non-transitory, computer-readable medium storing program instructions that, when executed by at least one processor, configures a network node, arranged to communicate with one or more user equipment (UEs) via a primary serving cell (PCell) and one or more selectively activated secondary cells (SCells), to perform the operations corresponding to embodiment 12.

What is claimed is:

1. A method performed by a user equipment (UE) arranged to communicate with a network node in a wireless network via a primary serving cell (PCell) and a selectively activated secondary cell (SCell), the method comprising:
  determining a receiver activity rate for the UE based on a periodic SCell measurement cycle configured for the UE by the network node;
  receiving, from the network node via the PCell, an activation request identifying the SCell;
  in response to the activation request, selecting one of a plurality of activation procedures for the SCell based on the receiver activity rate, wherein selecting one of a plurality of activation procedures for the SCell based on the receiver activity rate comprises:
    determining a duration, T, since the UE's last measurement of a signal transmitted by the SCell;
    determining whether T is greater than a first threshold, T0, that is a function of the receiver activity rate;
    when T is greater than T0, selecting a first activation procedure; and
    otherwise, selecting a second activation procedure; and
  activating the SCell according to the selected activation procedure.

2. The method of claim 1, wherein T0 is an integer multiple of the receiver activity rate.

3. The method of claim 1, wherein the first activation procedure comprises:
  measuring power and detecting measurement saturation in each of one or more signal blocks transmitted by the SCell, each signal block being received using one of a plurality of gain settings for a first amplifier;
  based on the power measurements and saturation detection, selecting one of the gain settings;
  determining a first receiver gain state corresponding to the SCell, comprising:
    measuring power in a further signal block transmitted by the SCell, the further signal block being received using the selected gain setting for the first amplifier;
    based on the power measured in the further signal block, determining a gain setting for a second amplifier; and storing the selected gain setting for the first amplifier and the determined gain setting for the second amplifier as the first receiver gain state.

4. The method of claim 3, wherein the first activation procedure further comprises performing the second activation procedure using the stored first receiver gain state.

5. The method of claim 1, wherein selecting the second activation procedure comprises:
 determining whether the receiver activity rate is less than a second threshold, T1;
 when the receiver activity rate is less than T1, selecting a fast second activation procedure having a duration Ta1; and
 otherwise, selecting a normal second activation procedure having a duration Ta2, wherein Ta2 is greater than Ta1.

6. The method of claim 5, wherein the normal second activation procedure comprises:
 using the stored first receiver gain state, performing one or more first measurements on a first signal block transmitted by the SCell; and
 based on the first measurements, performing the following operations:
  updating the stored first receiver gain state to a second receiver gain state; and
  storing first synchronization information.

7. The method of claim 6, wherein:
 performing one or more first measurements on a first signal block transmitted by the SCell comprises:
  performing at least one first measurement at each of one or more timing offsets covering a range of SCell timing uncertainty; and
  selecting a particular one of the timing offsets that corresponds to the maximum first measurement for the respective timing offsets;
 the stored first synchronization information is based on the selected timing offset; and
 updating the first receiver gain state to the second receiver gain state is based on the maximum first measurement corresponding to the selected timing offset.

8. The method of claim 6, wherein the second normal activation procedure further comprises performing the second fast activation procedure using the second receiver gain state and the first synchronization information.

9. The method of claim 6, wherein the second fast activation procedure comprises:
 using the second receiver gain state and the first synchronization information, performing one or more second measurements on a second signal block transmitted by the SCell; and
 determining channel state information (CSI) for the SCell based on the one or more second measurements.

10. The method of claim 9, wherein the second fast activation procedure further comprises updating at least one of the stored second receiver gain state and the stored first synchronization information based on the one or more second measurements.

11. The method of claim 1, wherein the receiver activity rate is also determined based on one or more of the following parameters:
 discontinuous reception (DRX) cycle periodicity;
 demodulation reference signal (DRS) occasion periodicity; and
 SS/PBCH block measurement timing configuration (SMTC) periodicity.

12. The method of claim 1, further comprising, based on the receiver activity rate, performing one or more measurements on signals transmitted by the SCell.

13. A non-transitory, computer-readable medium storing program instructions that, when executed by at least one processor of a user equipment (UE) arranged to communicate with a network node in a wireless network via a primary serving cell (PCell) and a selectively activated secondary cell (SCell), configure the UE to perform operations corresponding to the method of claim 1.

14. A user equipment (UE) arranged to communicate with a network node in a wireless network via a primary serving cell (PCell) and a selectively activated secondary cell (SCell), the UE comprising:
 a radio transceiver;
 at least one processor; and
 at least one memory storing program instructions that, when executed by the at least one processor, configure the UE to:
  determine a receiver activity rate for the UE based on a periodic SCell measurement cycle configured for the UE by the network node;
  receive, via the PCell, an activation request identifying the SCell;
  in response to the activation request from the PCell, select one of a plurality of activation procedures for the SCell based on the receiver activity rate,
   wherein execution of the instructions configures the UE to select one of a plurality of activation procedures for the SCell based on the receiver activity rate based on:
    determining a duration, T, since the UE's last measurement of a signal transmitted by the SCell;
    determining whether T is greater than a first threshold, T0, that is a function of the receiver activity rate;
    when T is greater than T0, selecting a first activation procedure; and
    otherwise, selecting a second activation procedure; and
  activate the SCell according to the selected activation procedure.

15. The UE of claim 14, wherein execution of the instructions configures the UE to activate the SCell according to the selected first activation procedure based on:
 measuring power and detecting measurement saturation in each of one or more signal blocks transmitted by the SCell, each signal block being received using one of a plurality of gain settings for a first amplifier;
 based on the power measurements and saturation detection, selecting one of the gain settings;
 determining a first receiver gain state corresponding to the SCell, comprising:
  measuring power in a further signal block transmitted by the SCell, the further signal block being received using the selected gain setting for the first amplifier;
  based on the power measured in the further signal block, determining a gain setting for a second amplifier; and
  storing the selected gain setting for the first amplifier and the determined gain setting for the second amplifier as the first receiver gain state.

16. The UE of claim 15, wherein execution of the instructions configures the UE to activate the SCell according to the selected first activation procedure further based on performing the second activation procedure using the stored first receiver gain state.

17. The UE of claim 14, wherein selecting the second activation procedure further comprises:

determining whether the receiver activity rate is less than a second threshold, T1;

when the receiver activity rate is less than T1, selecting a fast second activation procedure having a duration Ta1; and otherwise, selecting a normal second activation procedure having a duration Ta2, wherein Ta2 is greater than Ta1.

18. The UE of claim 17, wherein execution of the instructions configures the UE to activate the SCell according to the selected normal second activation procedure based on:

using the stored first receiver gain state, performing one or more first measurements on a first signal block transmitted by the SCell; and based on the first measurements, performing the following operations:

updating the stored first receiver gain state to a second receiver gain state; and storing first synchronization information.

19. The UE of claim 18, wherein:

execution of the instructions configures the UE to perform the one or more first measurements on the first signal block transmitted by the SCell based on:

performing at least one first measurement at each of one or more timing offsets covering a range of SCell timing uncertainty; and selecting a particular one of the timing offsets that corresponds to the maximum first measurement for the respective timing offsets;

the stored first synchronization information is based on the selected timing offset; and execution of the instructions configures the UE to update the first receiver gain state to the second receiver gain state based on the maximum first measurement corresponding to the selected timing offset.

20. The UE of claim 18, wherein execution of the instructions configures the UE to activate the SCell according to the selected normal second activation procedure further based on performing the second fast activation procedure using the second receiver gain state and the first synchronization information.

21. The UE of claim 18, wherein execution of the instructions configures the UE to activate the SCell according to the selected fast second activation procedure based on:

using the second receiver gain state and the first synchronization information, performing one or more second measurements on a second signal block transmitted by the SCell; and determining channel state information (CSI) for the SCell based on the one or more second measurements.

22. The UE of claim 21, wherein execution of the instructions configures the UE to activate the SCell according to the selected fast second activation procedure further based on updating at least one of the stored second receiver gain state and the stored first synchronization information based on the one or more second measurements.

* * * * *

UNITED STATES PATENT AND TRADEMARK OFFICE
CERTIFICATE OF CORRECTION

| | |
|---|---|
| PATENT NO. | : 11,533,767 B2 |
| APPLICATION NO. | : 16/225507 |
| DATED | : December 20, 2022 |
| INVENTOR(S) | : Axmon et al. |

It is certified that error appears in the above-identified patent and that said Letters Patent is hereby corrected as shown below:

In the Drawings

In Fig. 14, Sheet 14 of 14, for Tag "1460", in Lines 1-2, delete "Control Interface" and insert -- Host Control Interface --, therefor.

In the Specification

In Column 6, Line 35, delete "SI interface" and insert -- S1 interface --, therefor.

In Column 6, Line 53, delete "SI" and insert -- S1 --, therefor.

In Column 6, Line 54, delete "SI Protocols." and insert -- S1 Protocols. --, therefor.

In Column 13, Lines 44-45, delete "demodulation reference signal (DRS)" and insert -- demodulation reference signal (DM-RS) --, therefor.

In Column 13, Line 58, delete "one of more" and insert -- one or more --, therefor.

In Column 14, Line 10, delete "(L)" and insert -- (L1) --, therefor.

In Column 16, Line 3, delete "ban" and insert -- can --, therefor.

In Column 19, Line 23, delete "X" and insert -- X1 --, therefor.

In Column 19, Line 23, delete "X" and insert -- X1 --, therefor.

In Column 20, Line 6, delete "demodulation reference signal (DRS)" and insert -- demodulation reference signal (DM-RS) --, therefor.

In Column 21, Line 38, delete "T1," and insert -- T0, --, therefor.

Signed and Sealed this
Fourth Day of July, 2023

*Katherine Kelly Vidal*

Katherine Kelly Vidal
*Director of the United States Patent and Trademark Office*

CERTIFICATE OF CORRECTION (continued)
U.S. Pat. No. 11,533,767 B2

In Column 22, Lines 7-8, delete "host interface 1460." and insert -- host control interface 1460. --, therefor.

In Column 22, Line 24, delete "host interface 1460." and insert -- host control interface 1460. --, therefor.

In Column 22, Line 57, delete "and or" and insert -- and/or --, therefor.

In Column 24, Line 23, delete "control interface 1460" and insert -- host control interface 1460 --, therefor.

In Column 24, Line 28, delete "control interface 1460" and insert -- host control interface 1460 --, therefor.

In Column 24, Lines 32-33, delete "control interface 1460" and insert -- host control interface 1460 --, therefor.

In Column 24, Line 35, delete "control interface 1460" and insert -- host control interface 1460 --, therefor.

In Column 25, Line 20, delete "SI interface" and insert -- S1 interface --, therefor.

In Column 26, Line 7, delete "SI interface" and insert -- S1 interface --, therefor.

In Column 26, Line 39, delete "(OTI)" and insert -- (OTT) --, therefor.

In Column 27, Line 32, delete "OT" and insert -- OTT --, therefor.

In the Claims

In Column 33, Line 61, in Claim 11, delete "demodulation reference signal (DRS)" and insert -- demodulation reference signal (DM-RS) --, therefor.